(12) United States Patent
Jang et al.

(10) Patent No.: US 11,972,791 B2
(45) Date of Patent: Apr. 30, 2024

(54) METHOD AND DEVICE FOR READING DATA IN A NONVOLATILE MEMORY DEVICE BASED ON CELL COUNTS OF TWO STATES

(71) Applicant: SAMSUNG ELECTRONICS CO., LTD., Suwon-si (KR)

(72) Inventors: Hyojung Jang, Hwaseong-si (KR); Jinyoung Kim, Seoul (KR); Sehwan Park, Yongin-si (KR); Jisang Lee, Iksan-si (KR)

(73) Assignee: Samsung Electronics Co., Ltd. (KR)

( * ) Notice: Subject to any disclaimer, the term of this patent is extended or adjusted under 35 U.S.C. 154(b) by 45 days.

(21) Appl. No.: 17/689,480

(22) Filed: Mar. 8, 2022

(65) Prior Publication Data
US 2023/0108845 A1    Apr. 6, 2023

(30) Foreign Application Priority Data
Oct. 6, 2021  (KR) .......................... 10-2021-0132074

(51) Int. Cl.
    *G11C 11/4096*    (2006.01)
    *G11C 7/10*       (2006.01)
    (Continued)

(52) U.S. Cl.
CPC ........ *G11C 11/4096* (2013.01); *G11C 7/1039* (2013.01); *G11C 11/4074* (2013.01); *G11C 11/4085* (2013.01); *G11C 11/4099* (2013.01)

(58) Field of Classification Search
CPC ............ G11C 11/4096; G11C 11/4074; G11C 11/4085; G11C 11/4099; G11C 11/5642;
(Continued)

(56) References Cited

U.S. PATENT DOCUMENTS 9,064,575 B2   6/2015  Parthasarathy et al.
9,472,298 B1  10/2016  Louie et al.
(Continued)

FOREIGN PATENT DOCUMENTS

KR    1764511 B1   5/2017

OTHER PUBLICATIONS

Li et al., "A fast read retry method for 3D NAND flash memories using novel valley search algorithm," IEICE Electronics Express, 2018, 15(22):1-7.
(Continued)

*Primary Examiner* — Sultana Begum
(74) *Attorney, Agent, or Firm* — Fish & Richardson P.C.

(57) ABSTRACT

In a method of reading data in a nonvolatile memory device including a plurality of memory cells having a plurality of states including a first state and a second state, a first read operation for the first state is performed, and a second read operation for the second state is performed. To perform the first read operation, cell counts for a valley of the first state are obtained by performing a valley cell count operation for the first state, a first read voltage level for the first state is determined based on the cell counts and at least one first reference parameter for the first state, and a first sensing operation for the first state is performed by using the first read voltage level. To perform the second read operation, a second read voltage level for the second state is determined based on the cell counts and at least one second reference parameter for the second state, and a second sensing operation for the second state is performed by using the second read voltage level.

19 Claims, 16 Drawing Sheets

(51) Int. Cl.
*G11C 11/4074* (2006.01)
*G11C 11/408* (2006.01)
*G11C 11/4099* (2006.01)

(58) Field of Classification Search
CPC .......... G11C 7/1039; G11C 2211/5632; G11C 16/32; G11C 16/26; G11C 16/0483; G11C 16/08; G11C 16/24; G11C 29/021; G11C 29/028
See application file for complete search history.

(56) References Cited

U.S. PATENT DOCUMENTS

| | | | |
|---|---|---|---|
| 9,710,325 B2 | 7/2017 | Chen et al. | |
| 9,830,994 B1 | 11/2017 | Mitsuhira et al. | |
| 9,990,988 B2 | 6/2018 | Parthasarathy et al. | |
| 10,559,362 B2 | 2/2020 | Shin et al. | |
| 10,629,259 B2 | 4/2020 | Jang | |
| 10,811,090 B2 | 10/2020 | Parthasarathy et al. | |
| 11,393,551 B2 * | 7/2022 | Seo | G11C 7/1063 |
| 2021/0035631 A1 | 2/2021 | Parthasarathy et al. | |

OTHER PUBLICATIONS

Jeong et al., "Flashdefibrillator: a data recovery technique for retention failures in NAND flash memory," 2015 IEEE Non-Volatile Memory System and Applications Symposium (NVMSA), 2015 (Abstract Only).

* cited by examiner

METHOD AND DEVICE FOR READING DATA IN A NONVOLATILE MEMORY DEVICE BASED ON CELL COUNTS OF TWO STATES

CROSS-REFERENCE TO RELATED APPLICATION

This application claims priority under 35 USC § 119 to Korean Patent Application No. 10-2021-0132074, filed on Oct. 6, 2021 in the Korean Intellectual Property Office (KIPO), the contents of which are herein incorporated by reference in their entirety.

BACKGROUND

1. Technical Field

Exemplary embodiments relate generally to semiconductor integrated circuits, and more particularly to a method of reading data in a nonvolatile memory device, the nonvolatile memory device performing the method of reading data.

2. Description of the Related Art

Semiconductor memory devices can be roughly divided into two categories depending upon whether or not they retain stored data when disconnected from a power supply. These two categories are: volatile memory devices, which lose stored data when disconnected from power, and nonvolatile memory devices, which retain stored data when disconnected from power. Volatile memory devices may perform read and write operations at a high speed, while contents stored therein may be lost at power-off. Nonvolatile memory devices may retain contents stored therein even at power-off, which means they may be used to store data that must be retained regardless of whether they are powered or not.

To store data, memory cells in a nonvolatile memory device may be programmed to have threshold voltage distributions representing different states. During (and/or following) programming of the memory cells, their intended threshold voltage distributions may be undesirably shifted or broadened due to charge leakage, program disturbances, word and/or bit line coupling, temperature changes, voltage changes, etc, and the threshold voltage distributions may overlap each other.

SUMMARY

At least one exemplary embodiment of the present disclosure provides a method of reading data in a nonvolatile memory device capable of rapidly and accurately determining a read voltage level for each state.

At least one exemplary embodiment of the present disclosure provides a nonvolatile memory device capable of rapidly and accurately determining a read voltage level for each state.

According to exemplary embodiments, in a method of reading data in a nonvolatile memory device including a plurality of memory cells having a plurality of states including a first state and a second state, a first read operation for the first state is performed, and a second read operation for the second state is performed. To perform the first read operation, cell counts for a valley of the first state are obtained by performing a valley cell count operation for the first state, a first read voltage level for the first state is determined based on the cell counts and at least one first reference parameter for the first state, and a first sensing operation for the first state is performed by using the first read voltage level. To perform the second read operation, a second read voltage level for the second state is determined based on the cell counts and at least one second reference parameter for the second state, and a second sensing operation for the second state is performed by using the second read voltage level.

According to exemplary embodiments, in a method of reading data in a nonvolatile memory device including a plurality of memory cells having a plurality of states including a first state and a second state, a first read operation for the first state is performed, and a second read operation for the second state is performed. To perform the first read operation, a first read voltage having a reference read voltage level for the first state is applied to a wordline connected to the plurality of memory cells, first on-cells having threshold voltages lower than or equal to a first count voltage level lower than the reference read voltage level are counted by performing a sensing node latch operation at a previous time point before a reference time point, second on-cells having threshold voltages lower than or equal to a second count voltage level that is the reference read voltage level are counted by performing the sensing node latch operation at the reference time point, third on-cells having threshold voltages lower than or equal to the third count voltage level higher than the reference read voltage level are counted by performing the sensing node latch operation at a subsequent time point after the reference time point, a first cell count is calculated by subtracting a number of the first on-cells from a number of the second on-cells, a second cell count is calculated by subtracting the number of the second on-cells from a number of the third on-cells, a first read voltage level for the first state is determined based on the first cell count, the second cell count and at least one first reference parameter for the first state, and a first sensing operation for the first state is performed by performing the sensing node latch operation at a time point corresponding to the first read voltage level. To perform the second read operation, a second read voltage level for the second state is determined based on the first cell count, the second cell count and at least one second reference parameter for the second state, and a second sensing operation for the second state is performed by applying a second read voltage having the second read voltage level to the wordline.

According to exemplary embodiments, a nonvolatile memory device includes a memory cell array including a plurality of memory cells having a plurality of states including a first state and a second state, and a control circuit configured to perform a first read operation for the first state and a second read operation for the second state. To perform the first read operation, the control circuit obtains cell counts for a valley of the first state by performing a valley cell count operation for the first state, determines a first read voltage level for the first state based on the cell counts and at least one first reference parameter for the first state, and performs a first sensing operation for the first state by using the first read voltage level. To perform the second read operation, the control circuit determines a second read voltage level for the second state based on the cell counts and at least one second reference parameter for the second state, and performs a second sensing operation for the second state by using the second read voltage level.

In the method of reading data in the nonvolatile memory device and the nonvolatile memory device according to exemplary embodiments, cell counts for a valley of a first state may be obtained by performing a valley cell count operation for the first state, a first read voltage level for the first state may be determined based on the cell counts and a first reference parameter for the first state, and a second read voltage level for a second state may be determined based on the cell counts and a second reference parameter for the second state. Accordingly, since the second read voltage level for the second state (e.g., a low state) is determined using the cell counts for the first state (e.g., a high state), an optimal read voltage level for each state may be rapidly and accurately determined.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE PREFFERED EMBODIMENTS

Figure 1:
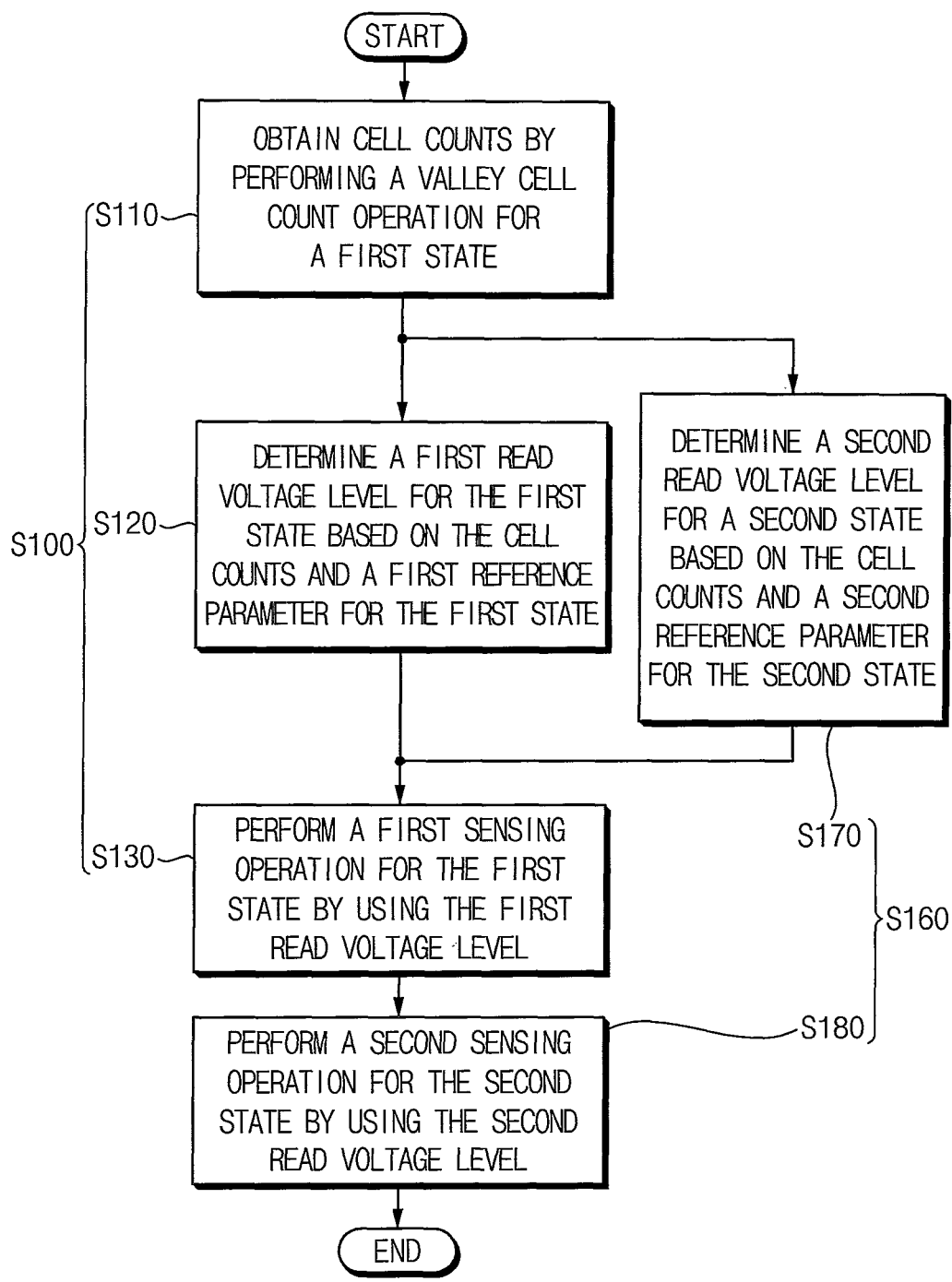
FIG. 1 is a flowchart illustrating a method of reading data in a nonvolatile memory device according to exemplary embodiments.

Various exemplary embodiments will be described more fully with reference to the accompanying drawings, in which such embodiments are shown. The present disclosure may, however, be embodied in many different forms and should not be construed as limited to the embodiments set forth herein. Like reference numerals refer to like elements throughout this disclosure.

Figure 2:
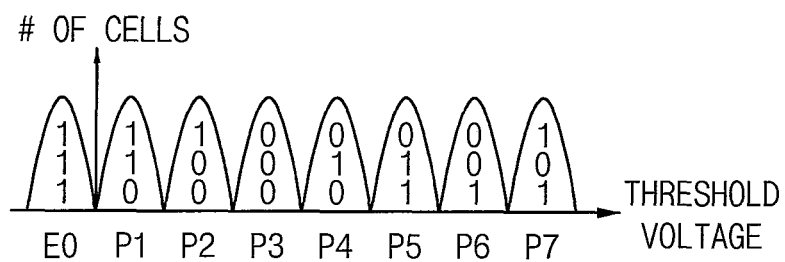
FIG. 2 is a diagram for describing an example of threshold voltage distributions of memory cells and examples of respective page read operations.
Figure 2:
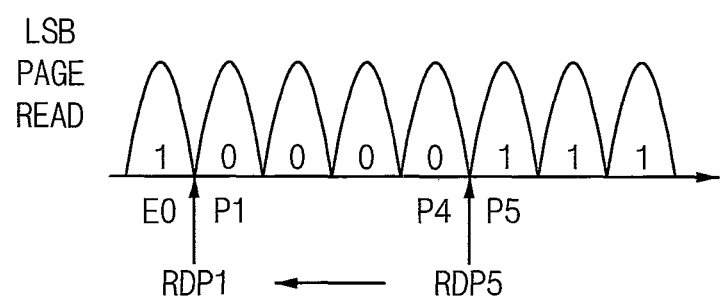
Figure 2:
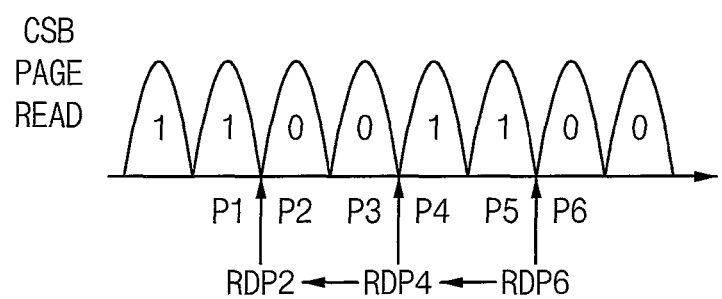
Figure 2:
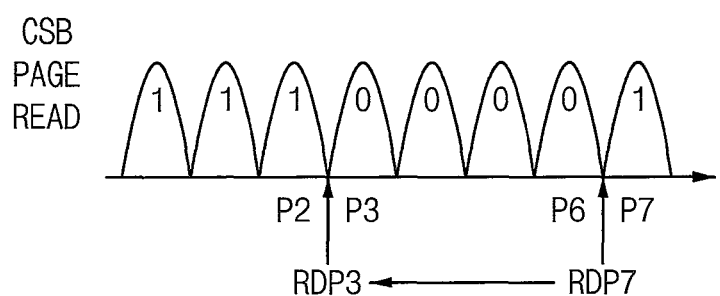
Figure 3:
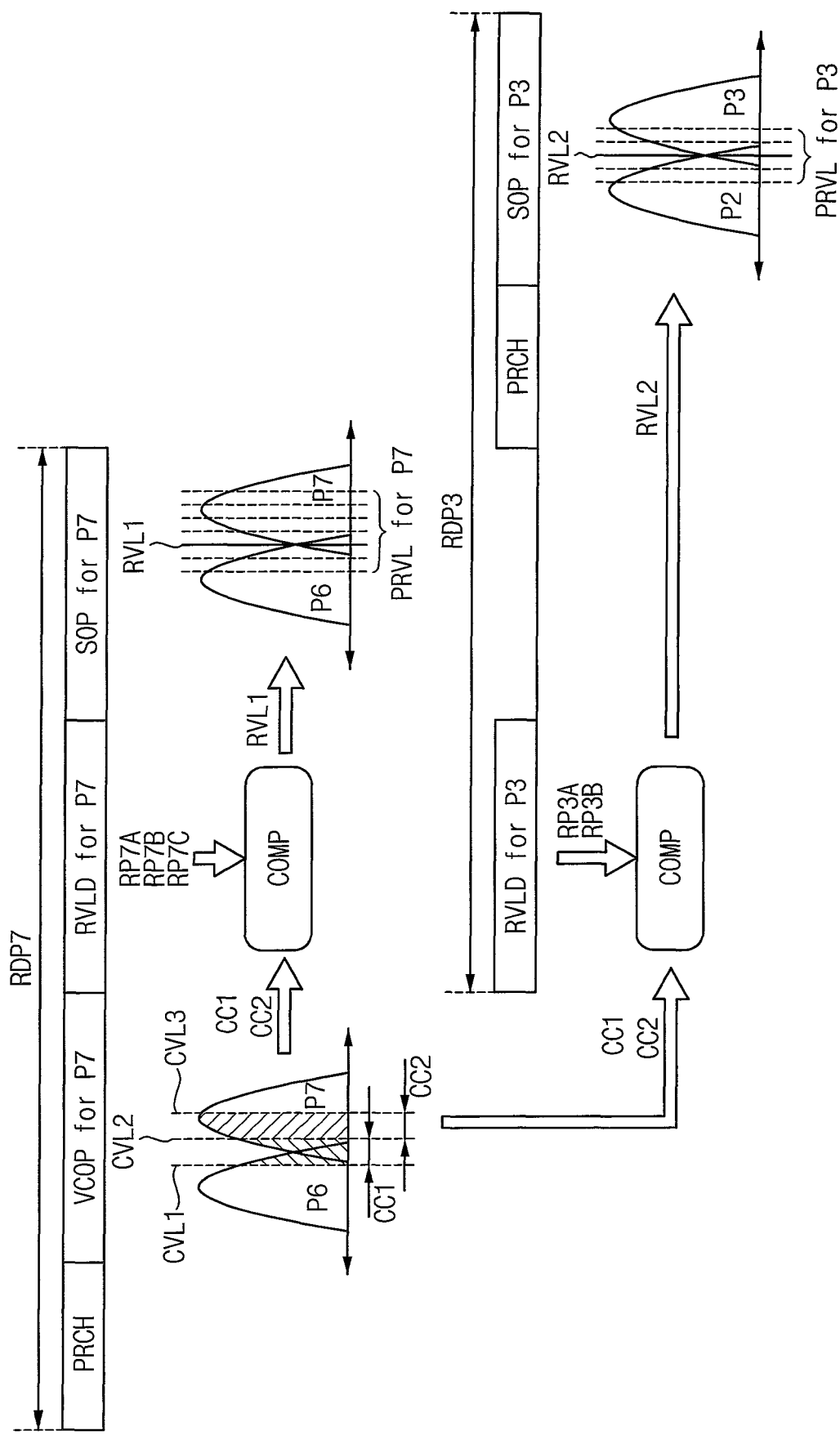
FIG. 3 is a diagram for describing an example of a most significant bit (MSB) page read operation according to exemplary embodiments.
Figure 4:
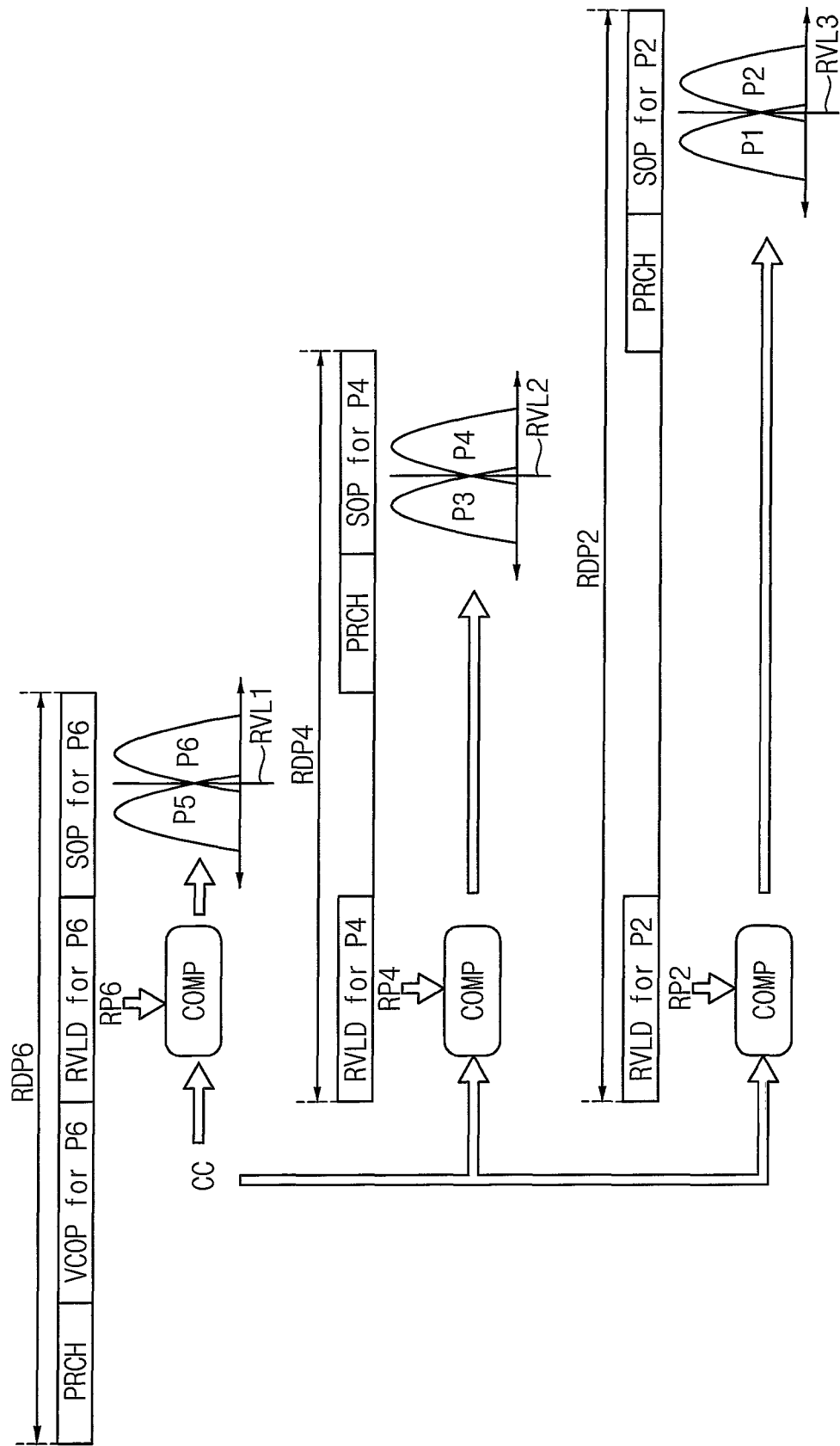
FIG. 4 is a diagram for describing an example of a central significant bit (CSB) page read operation according to exemplary embodiments.

FIG. 1 is a flowchart illustrating a method of reading data in a nonvolatile memory device according to exemplary embodiments, FIG. 2 is a diagram for describing an example of threshold voltage distributions of memory cells and examples of respective page read operations, FIG. 3 is a diagram for describing an example of a most significant bit (MSB) page read operation according to exemplary embodiments, and FIG. 4 is a diagram for describing an example of a central significant bit (CSB) page read operation according to exemplary embodiments.

Referring to FIG. 1, in a method of reading data in a nonvolatile memory device according to exemplary embodiments, a first read operation for a first state may be performed (step S100), and a second read operation for a second state may be performed (step S160). Memory cells of the nonvolatile memory device may be multi-level cells that store two or more bits of data. Further, the memory cells connected to one wordline may form a plurality of pages, and the first and second read operations may be included in a page read operation for one of the plurality of pages. In some exemplary embodiments, the memory cells may have a plurality of states including the first state and the second state, the first state may be a high state higher than the second state, and the second state may be a low state lower than the first state.

For example, as illustrated in FIG. 2, the memory cells (connected to one wordline) may have an erase state E0 representing data '111', a first program state P1 representing data '110', a second program state P2 representing data '100', a third program state P3 representing data '000', a fourth program state P4 representing data '010', a fifth program state P5 representing data '011, a sixth program state P6 representing data '001' and a seventh program state P7 representing data '101'. A least significant bit (LSB) page read operation for the memory cells may include a fifth program state read operation RDP5 that distinguishes between the fifth program state P5 and the fourth program state P4 adjacent to the fifth program state P5, and a first program state read operation RDP1 that distinguishes between the first program state P1 and the erase state E0 adjacent to the first program state P1. In some exemplary embodiments, the fifth program state read operation RDP5 may be first performed, and then the first program state read operation RDP1 may be performed. A central significant bit (CSB) page read operation for the memory cells may include a sixth program state read operation RDP6 that distinguishes between the sixth program state P6 and the fifth program state P5 adjacent to the sixth program state P6, a fourth program state read operation RDP4 that distinguishes between the fourth program state P4 and the third program state P3 adjacent to the fourth program state P4, and a second program state read operation RDP2 that distinguishes between the second program state P2 and the first program state P1 adjacent to the second program state P2. In some exemplary embodiments, the second, fourth and sixth program state read operations RDP2, RDP4 and RDP6 may be performed in an order of the sixth program state read operation RDP6, the fourth program state read operation RDP4 and the second program state read operation RDP2. Further, a most significant bit (MSB) page read operation for the memory cells may include a seventh program state read operation RDP7 that distinguishes between the seventh program state P7 and the sixth program state P6 adjacent to the seventh program state P7, and a third program state read operation RDP3 that distinguishes between the third program state P3 and the second program state P2 adjacent to the third program state P3. In some exemplary embodiments, the seventh program state read operation RDP7 may be first performed, and then the third program state read operation RDP3 may be performed. Although FIG. 2 illustrates an example where the memory cell is a triple level cell (TLC) that stores 3-bit data, the memory cell of the nonvolatile memory device according to exemplary embodiments may be any multi-level cell. For example, the memory cell may be, but not limited to, a quadruple level cells (QLC) that stores 4-bit data.

Referring to FIGS. 1, 2 and 3, in a case where the method according to exemplary embodiments is a method of performing the MSB page read operation, the first state may be the seventh program state P7, the second state may be the third program state P3, the first read operation may be the seventh program state read operation RDP7, and the second read operation may be the third program state read operation RDP3.

To perform the first read operation for the first state, or the seventh program state read operation RDP7 (step S100), a precharge operation PRCH may be performed, a valley cell count operation VCOP for the seventh program state P7 may be performed (step S110), a read voltage level determination operation RVLD for the seventh program state P7 may be performed (step S120), and a first sensing operation SOP for the seventh program state P7 may be performed (step S130). The precharge operation PRCH may precharge bitlines and/or sensing nodes of a page buffer circuit of the nonvolatile memory device. The valley cell count operation VCOP for the first state, or the seventh program state P7 may obtain cell counts CC1 and CC2 for a valley of the seventh program state P7, or a valley between the seventh program state P7 and the sixth program state P6 adjacent to the seventh program state P7 (step S110). In some exemplary embodiments, the valley cell count operation VCOP for the seventh program state P7 may be performed using a second count voltage level CVL2 that is a reference read voltage level for the seventh program state P7, a first count voltage level CVL1 lower than the reference read voltage level, and a third count voltage level CVL3 higher than the reference read voltage level, and the cell counts CC1 and CC2 obtained by the valley cell count operation VCOP may include a first cell count CC1 of memory cells having threshold voltages between the first count voltage level CVL1 and the second count voltage level CVL2, and a second cell count CC2 of memory cells having threshold voltages between the second count voltage level CVL2 and the third count voltage level CVL3. The read voltage level determination operation RVLD for the first state, or the seventh program state P7 may determine a first read voltage level RVL1 for the first state, or the seventh program state P7 based on the cell counts CC1 and CC2 and at least one first reference parameter RP7A, RP7B and RP7C for the seventh program state P7 (step S120). In some exemplary embodiments, the first cell count CC1 and/or the second cell count CC2 may be compared with the at least one first reference parameter RP7A, RP7B and RP7C, and the first read voltage level RVL1 may be determined according to a result of the comparison. For example, the at least one first reference parameter RP7A, RP7B and RP7C may include three reference parameters RP7A, RP7B and RP7C having different values, a comparison operation COMP of the first cell count CC1 and/or the second cell count CC2 with the three reference parameters RP7A, RP7B and RP7C may be performed, and an optimal read voltage level may be selected as the first read voltage level RVL1 from a plurality of read voltage levels PRVL (e.g., seven read voltage levels PRVL) for the seventh program state P7 according to a result of the comparison operation COMP. In some exemplary embodiments, the valley cell count operation VCOP and the read voltage level determination operation RVLD may be referred to as a valley search operation or an on-chip valley search (OVS) operation. The first sensing operation SOP for the first state, or the seventh program state P7 may read data stored in the memory cells by using the first read voltage level RVL1 (step S130).

After the first read operation for the first state is performed, the second read operation for the second state may be performed. To perform the second read operation for the second state, or the third program state read operation RDP3 (step S160), a read voltage level determination operation RVLD for the third program state P3 may be performed (step S170), the precharge operation PRCH may be performed, and a second sensing operation SOP for the third program state P3 may be performed (step S180). The read voltage level determination operation RVLD for the second state, or the third program state P3 may determine a second read voltage level RVL2 for the second state, or the third program state P3 based on the cell counts CC1 and CC2 for the first state, or the seventh program state P7, and at least one second reference parameter RP3A and RP3B for the third program state P3 (step S170). In some exemplary embodiments, the first cell count CC1 and/or the second cell count CC2 may be compared with the at least one second reference parameter RP3A and RP3B, and the second read voltage level RVL2 may be determined according to a result of the comparison. For example, the at least one second reference parameter RP3A and RP3B may include two reference parameters RP3A and RP3B having different values, a comparison operation COMP of the first cell count CC1 and/or the second cell count CC2 with the two reference parameters RP3A and RP3B may be performed, and an optimal read voltage level may be selected as the second read voltage level RVL2 from a plurality of read voltage levels PRVL (e.g., five read voltage levels PRVL) for the third program state P3 according to a result of the comparison operation COMP. The precharge operation PRCH may precharge the bitlines and/or the sensing nodes. The second sensing operation SOP for the second state, or the third program state P3 may read data stored in the memory cells by using the second read voltage level RVL2 (step S180).

In some exemplary embodiments, the read voltage level determination operation RVLD for the first state (e.g., the high state) and the read voltage level determination operation RVLD for the second state (e.g., the low state) may be substantially simultaneously performed by different state determination blocks of the nonvolatile memory device. Thus, the different state determination blocks may substantially simultaneously determine the first and second read voltage levels RVL1 and RVL2 for the first and second states by using different logics, respectively.

In some exemplary embodiments, the at least one first reference parameter RP7A, RP7B and RP7C for the first state and the at least one second reference parameter RP3A and RP3B for the second state may have different values, and/or the number of the at least one first reference parameter RP7A, RP7B and RP7C for the first state and the number of the at least one second reference parameter RP3A and RP3B for the second state may be different from each other. Since reference parameters have different values and/ or different numbers with respect to the first state (e.g., the high state) and the second state (e.g., the low state), an optimal read voltage level suitable for each state may be determined by using a reference parameter suitable for each state.

Referring to FIGS. 1, 2 and 4, in a case where the method according to exemplary embodiments is a method of performing the CSB page read operation, the first state may be the sixth program state P6, the second state may be the fourth program state P4, the first read operation may be the sixth program state read operation RDP6, and the second read operation may be the fourth program state read operation RDP4. The method according to exemplary embodiments may further perform a third read operation for a third state, the third state may be the second program state P2, and the third read operation may be the second program state read operation RDP2.

The sixth program state read operation RDP6 may include the precharge operation PRCH, a valley cell count operation VCOP for the sixth program state P6, a read voltage level determination operation RVLD for the sixth program state P6, and a first sensing operation SOP for the sixth program state P6. The read voltage level determination operation RVLD for the sixth program state P6 may include a comparison operation COMP of cell counts CC for the sixth program state P6 with at least one first reference parameter RP6, and a first read voltage level RVL1 for the sixth program state P6 may be determined according to a result of the comparison operation COMP.

The fourth program state read operation RDP4 may include a read voltage level determination operation RVLD for the fourth program state P4, the precharge operation PRCH, and a second sensing operation SOP for the fourth program state P4. The read voltage level determination operation RVLD for the fourth program state P4 may include a comparison operation COMP of the cell counts CC for the sixth program state P6 with at least one second reference parameter RP4, and a second read voltage level RVL2 for the fourth program state P4 may be determined according to a result of the comparison operation COMP.

The second program state read operation RDP2 may include a read voltage level determination operation RVLD for the second program state P2, the precharge operation PRCH, and a third sensing operation SOP for the second program state P2. The read voltage level determination operation RVLD for the second program state P2 may include a comparison operation COMP of the cell counts CC for the sixth program state P6 with at least one third reference parameter RP2, and a third read voltage level RVL3 for the second program state P2 may be determined according to a result of the comparison operation COMP.

In some exemplary embodiments, the read voltage level determination operations RVLD for the sixth program state P6, the fourth program state P4 and the second program state P2 may be substantially simultaneously performed by different state determination blocks. Further, the first, second and third reference parameters RP6, RP4 and RP2 for the sixth, fourth and second program states P6, P4 and P2 may have different values and/or different numbers. Accordingly, an optimal read voltage level suitable for each state may be determined by using a reference parameter suitable for each state.

Alternatively, in a case where the method according to exemplary embodiments is a method of performing the LSB page read operation, the first state may be the fifth program state P5, the second state may be the first program state P1, the first read operation may be the fifth program state read operation RDP5, and the second read operation may be the first program state read operation RDP1. The LSB page read operation may be similar to the MSB page read operation illustrated in FIG. 3.

As described above, in the method of reading data in the nonvolatile memory device according to exemplary embodiments, the first read voltage level for the first state may be determined based on the cell counts for the first state and the first reference parameter for the first state, and the second read voltage level for the second state may be determined based on the cell counts for the first state and the second reference parameter for the second state. Accordingly, since the second read voltage level for the second state (e.g., the low state) is determined using the cell counts for the first state (e.g., the high state), an optimal read voltage level for each state may be rapidly and accurately determined.

Figure 5:
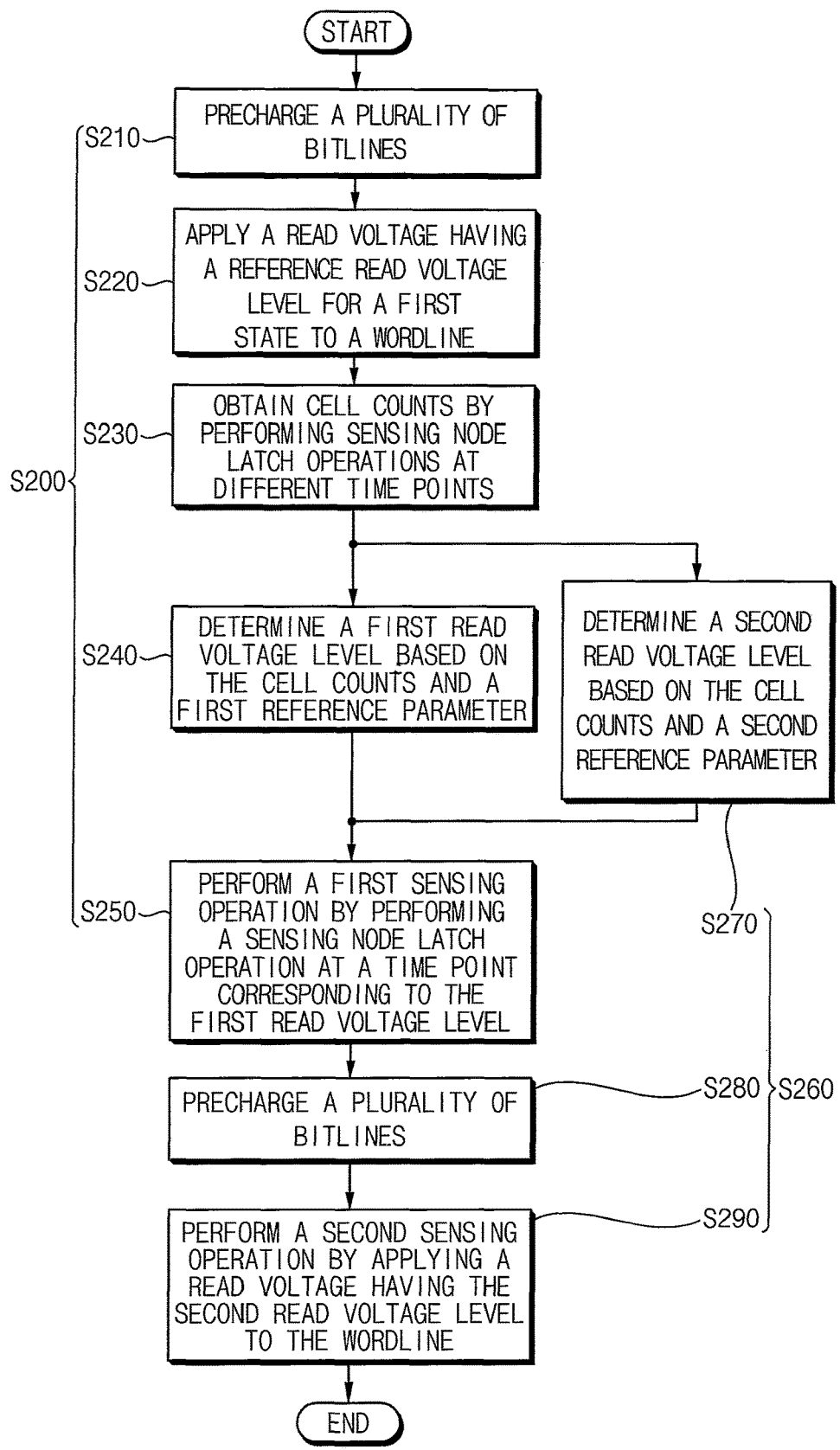
FIG. 5 is a flowchart illustrating a method of reading data in a nonvolatile memory device according to exemplary embodiments.
Figure 6:
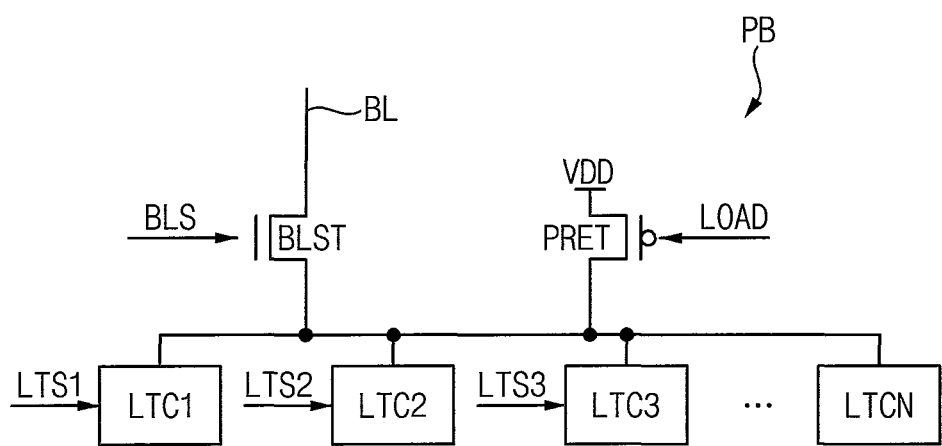
FIG. 6 is a diagram illustrating an example of each page buffer of a nonvolatile memory device according to exemplary embodiments.
Figure 7:
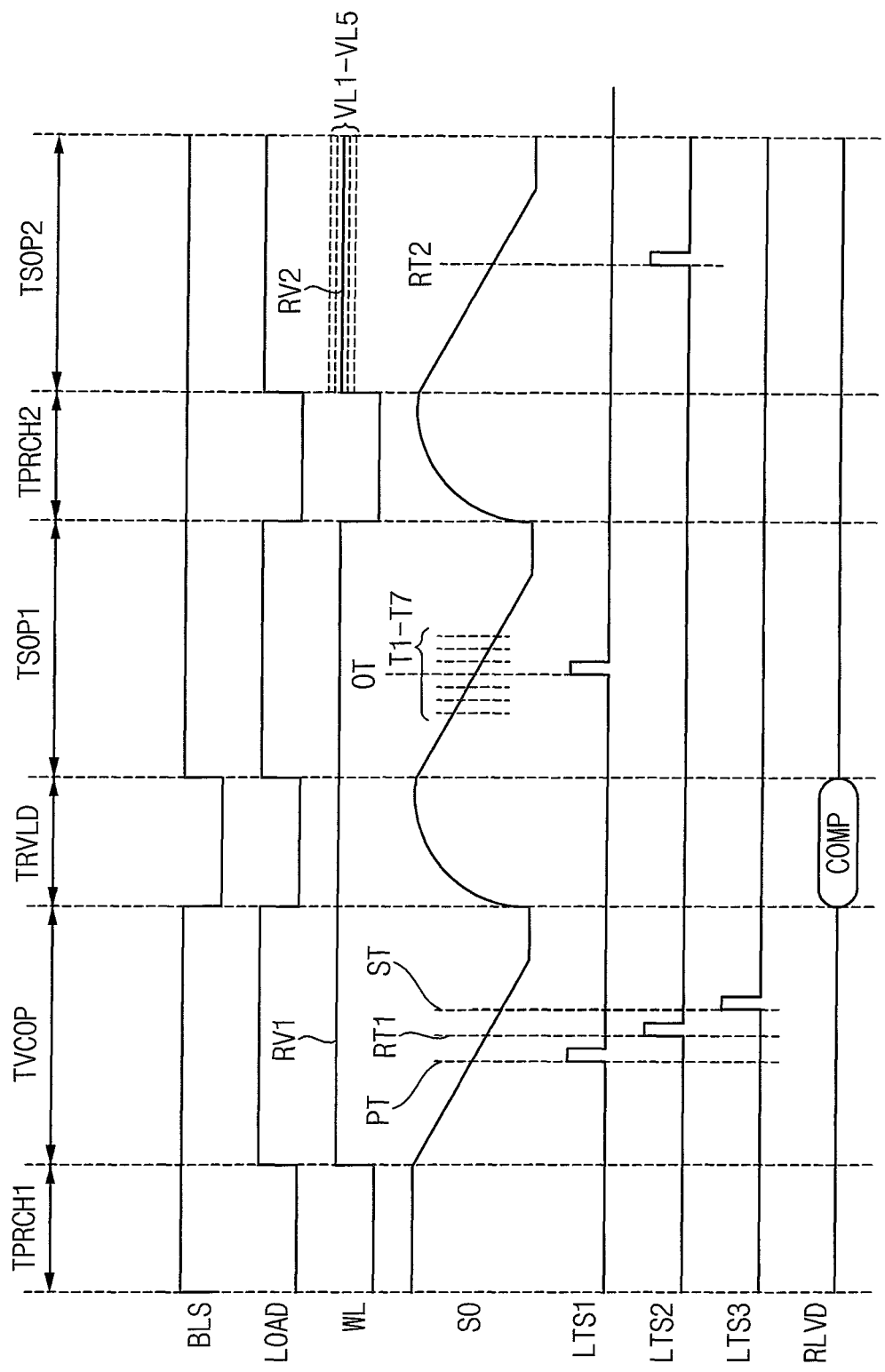
FIG. 7 is a timing diagram for describing an example of a method of reading data in a nonvolatile memory device according to exemplary embodiments.

FIG. 5 is a flowchart illustrating a method of reading data in a nonvolatile memory device according to exemplary embodiments, FIG. 6 is a diagram illustrating an example of each page buffer of a nonvolatile memory device according to exemplary embodiments, and FIG. 7 is a timing diagram for describing an example of a method of reading data in a nonvolatile memory device according to exemplary embodiments.

Referring to FIG. 5, in a method of reading data in a nonvolatile memory device including a plurality of memory cells having a plurality of states including a first state and a second state, a first read operation for the first state may be performed (step S200), and a second read operation for the second state may be performed (step S260). The first read operation may be a read operation for a high state among a page read operation for one page, and the second read operation may be a read operation for a low state among the page read operation for the page. To perform the first and second read operations, each page buffer of a page buffer circuit of the nonvolatile memory device may include a plurality of latches.

For example, as illustrated in FIG. 6, each page buffer PB may include a bitline select transistor BLST, a precharge transistor PRET and a plurality of latches LTC1, LTC2, LTC3, LTCN. The bitline select transistor BLST may connect a bitline BL and a sensing node SO in response to a bitline select signal BLS. The precharge transistor PRET may apply a power supply voltage VDD to the sensing node SO in response to a load signal LOAD. Each of the plurality of latches LTC1 through LTCN may perform a sensing node latch operation that stores data by sensing a voltage of the sensing node SO in response to a latch signal LTS1, LTS2 and LTS3. For example, a first latch LTC1 may perform the sensing node latch operation in response to a first latch signal LTS1, a second latch LTC2 may perform the sensing node latch operation in response to a second latch signal LTS2, and a third latch LTC3 may perform the sensing node latch operation in response to a third latch signal LTS3.

Referring to FIGS. 5 through 7, the first read operation for the first state may be performed during a first precharge time TPRCH1, a valley cell count time TVCOP, a read voltage level determination time TRVLD and a first sensing time TSOP1, and the second read operation for the second state may be performed during the read voltage level determination time TRVLD, a second precharge time TPRCH2 and a second sensing time TSOP2.

In the first precharge time TPRCH1, a plurality of bitlines BL and sensing nodes SO of respective page buffers PB may be precharged (step S210). For example, the bitline select signal BLS having a high level and the load signal LOAD having a low level may be applied to each page buffer PB, the bitline select transistor BLST may connect the bitline BL and the sensing node SO in response to the bitline select signal BLS having the high level, and the precharge transistor PRET may apply the power supply voltage VDD to the sensing node SO in response to the load signal LOAD having the low level. Accordingly, the plurality of bitlines BL and the sensing nodes SO of the respective page buffers PB may be precharged to the power supply voltage VDD. In some exemplary embodiments, while the first read operation is performed, the plurality of bitlines BL connected to the plurality of memory cells may be precharged only once. That is, the plurality of bitlines BL may be precharged in the first precharge time TPRCH1, and may not be precharged in the valley cell count time TVCOP, the read voltage level determination time TRVLD and the first sensing time TSOP1.

While the first read operation is performed, a read voltage RV1 having a reference read voltage level for the first state may be applied to a wordline WL connected to the plurality of memory cells (step S220). For example, the same read voltage RV1 may be applied to the wordline WL during the entire time TPRCH1, TVCOP, TRVLD and TSOP1 for the first read operation. In another example, as illustrated in FIG. 7, the same read voltage RV1 may be applied to the wordline WL during the valley cell count time TVCOP, the read voltage level determination time TRVLD and the first sensing time TSOP1.

In the valley cell count time TVCOP, cell counts for a valley of the first state may be obtained by performing sensing node latch operations at different time points PT, RT1 and ST (step S230). For example, as illustrated in FIGS. 3, 6 and 7, the first latches LTC1 may perform the sensing node latch operation in response to the first latch signal LTS1 at a previous time point PT before a reference time point RT1 for the first state, and first on-cells having threshold voltages lower than or equal to a first count voltage level CVL1 corresponding to the previous time point PT may be counted based on data stored in the first latches LTC1. Further, the second latches LTC2 may perform the sensing node latch operation in response to the second latch signal LTS2 at the reference time point RT1, and second on-cells having threshold voltages lower than or equal to a second count voltage level CVL2 corresponding to the reference time point RT1 may be counted based on data stored in the second latches LTC2. Further, the third latches LTC3 may perform the sensing node latch operation in response to the third latch signal LTS3 at a subsequent time point ST after the reference time point RT1, and third on-cells having threshold voltages lower than or equal to a third count voltage level CVL3 corresponding to the subsequent time point ST may be counted based on data stored in the third latches LTC3. Here, the second count voltage level CVL2 may be the reference read voltage level of the read voltage RV1, and the data latched or sensed at the reference time point RT1 may represent whether the threshold voltages of the memory cells may be below (or equal to) or above the second count voltage level CVL2, or the reference read voltage level. Further, the data latched or sensed at the previous time point PT before the reference time point RT1 may represent whether the threshold voltages of the memory cells may be below (or equal to) or above the first count voltage level CVL1 lower than the reference read voltage level, and the data latched or sensed at the subsequent time point ST after the reference time point RT1 may represent whether the threshold voltages of the memory cells may be below (or equal to) or above the third count voltage level CVL3 higher than the reference read voltage level. Thus, advancing a time point of the sensing node latch operation, or shortening a develop time of the sensing node SO may have substantially the same effect as decreasing a voltage level of the read voltage RV1, and delaying the time point of the sensing node latch operation, or lengthening the develop time of the sensing node SO may have substantially the same effect as increasing the voltage level of the read voltage RV1. Further, a first cell count CC1 of memory cells having threshold voltages between the first count voltage level CVL1 and the second count voltage level CVL2 may be calculated by subtracting the number of the first on-cells from the number of the second on-cells, and a second cell count CC2 of memory cells having threshold voltages between the second count voltage level CVL2 and the third count voltage level CVL3 may be calculated by subtracting the number of the second on-cells from the number of the third on-cells.

In the read voltage level determination time TRVLD, a first read voltage level RVL1 for the first state may be determined based on the first and second cell counts CC1 and CC2 for the first state and at least one first reference parameter RP7A, RP7B and RP7C for the first state (step S240), and a second read voltage level RVL2 for the second state may be determined based on the first and second cell counts CC1 and CC2 for the first state and at least one second reference parameter RP3A and RP3B for the second state (step S270). For example, a comparison operation COMP of the first cell count CC1 and/or the second cell count CC2 with the first reference parameter RP7A, RP7B and RP7C may be performed, and the first read voltage level RVL1 for the first state may be determined according to a result of the comparison operation COMP. Further, a comparison operation COMP of the first cell count CC1 and/or the second cell count CC2 with the second reference parameter RP3A and RP3B may be performed, and the second read voltage level RVL2 for the second state may be determined according to a result of the comparison operation COMP. In some exemplary embodiments, the first reference parameter RP7A, RP7B and RP7C and the second reference parameter RP3A and RP3B may have different values and/or different numbers. Further, in the read voltage level determination time TRVLD, the bitline select signal BLS having a low level and the load signal LOAD having a low level may be applied to each page buffer PB, the bitline select transistor BLST may disconnect the bitline BL from the sensing node SO in response to the bitline select signal BLS having the low level, and the precharge transistor PRET may apply the power supply voltage VDD to the sensing node SO in response to the load signal LOAD having the low level. Accordingly, the plurality of bitlines BL may not be precharged, and the sensing nodes SO of the respective page buffers PB may be precharged to the power supply voltage VDD.

In the first sensing time TSOP1, a first sensing operation for the first state may be performed (step S250). In some exemplary embodiments, an optimal time point OT corresponding to the first read voltage level RVL1 may be selected from a plurality of time points T1-T7, and the first sensing operation may be performed by performing the sensing node latch operation at the optimal time point OT. For example, in a case where the first read voltage level RVL1 is substantially the same as the reference read voltage level for the first state, the optimal time point OT may correspond to the reference time point RT1. Alternatively, in a case where the first read voltage level RVL1 is lower than the reference read voltage level, a time point earlier than the reference time point RT1 may be selected as the optimal time point OT from the plurality of time points T1-T7.

Further, in a case where the first read voltage level RVL1 is higher than the reference read voltage level, a time point later than the reference time point RT1 may be selected as the optimal time point OT from the plurality of time points T1-T7. For example, the first latches LTC1 may perform the sensing node latch operation in response to the first latch signal LTS1 that is activated at the optimal time point OT, and thus the data stored in the first latches LTC1 may represent whether the threshold voltages of the memory cells may be below (or equal to) or above the first read voltage level RVL1.

In the second precharge time TPRCH2, the plurality of bitlines BL and the sensing nodes SO of the respective page buffers PB may be precharged (step S280).

In the second sensing time TSOP2, a second sensing operation for the second state may be performed by applying a read voltage RV2 having the second read voltage level RVL2 to the wordline WL (step S290). The second read voltage level RVL2 may be selected from a plurality of voltage levels VL1-VL5 according to the result of the comparison operation COMP. Further, the second latches LTC2 may perform the sensing node latch operation in response to the second latch signal LTS2 that is activated at a reference time point RT2 for the second state, and the data stored in the second latches LTC2 may represent whether the threshold voltages of the memory cells may be below (or equal to) or above the second read voltage level RVL2.

Figure 8:
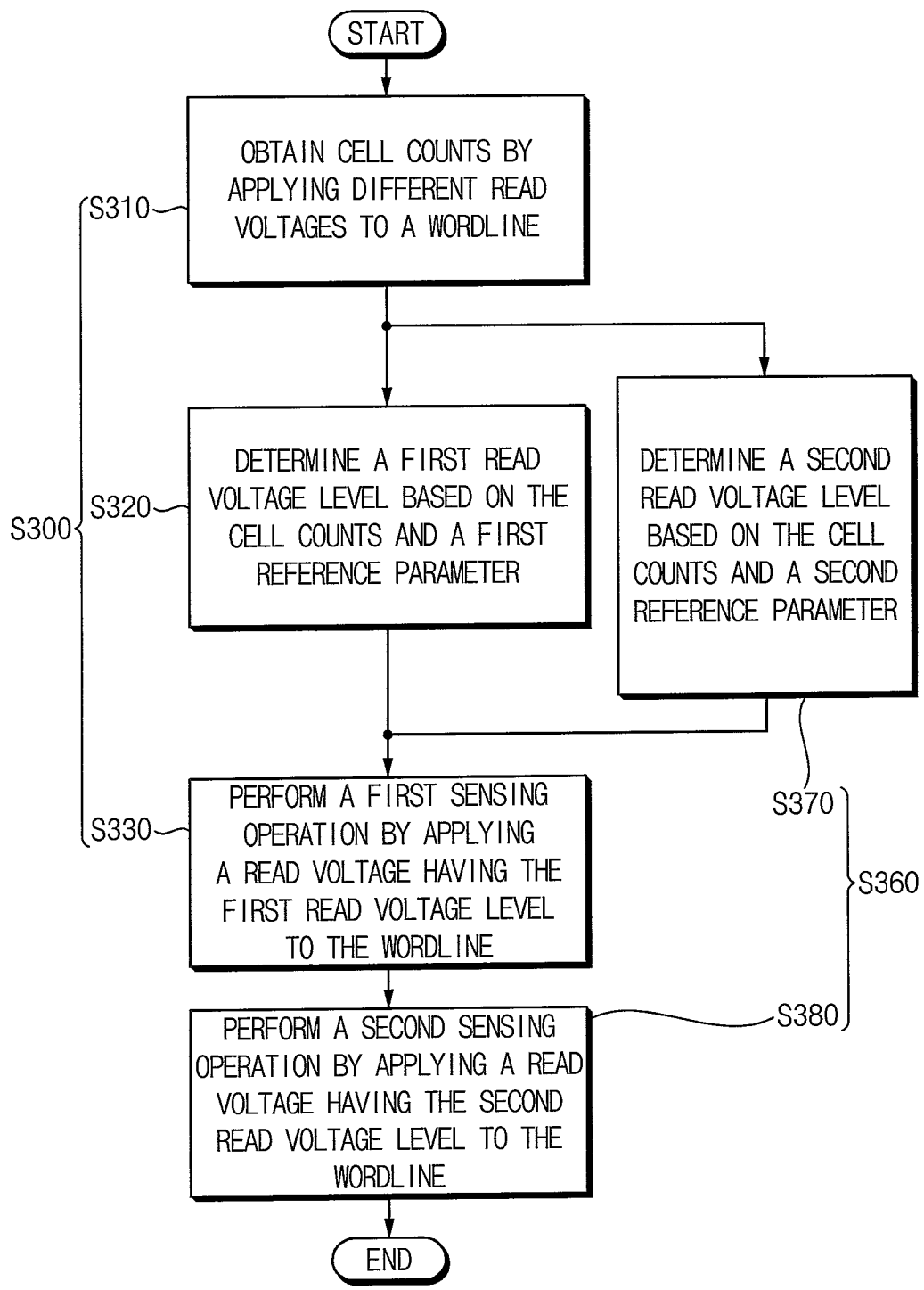
FIG. 8 is a flowchart illustrating a method of reading data in a nonvolatile memory device according to exemplary embodiments.
Figure 9:
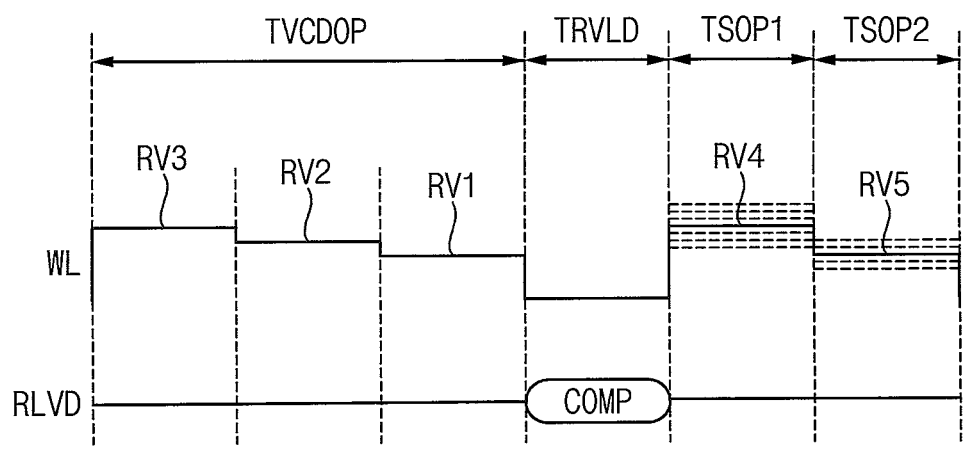
FIG. 9 is a timing diagram for describing an example of a method of reading data in a nonvolatile memory device according to exemplary embodiments.

FIG. 8 is a flowchart illustrating a method of reading data in a nonvolatile memory device according to exemplary embodiments, and FIG. 9 is a timing diagram for describing an example of a method of reading data in a nonvolatile memory device according to exemplary embodiments.

Referring to FIGS. 8 and 9, in a method of reading data in a nonvolatile memory device, a first read operation for a first state may be performed (step S300), and a second read operation for a second state may be performed (step S360). Unlike a method of FIG. 5 which obtains cell counts by performing sensing node latch operations at different time points, the method of FIG. 8 may obtain the cell counts by using different read voltages RV3, RV2 and RV1.

In a valley cell count time TVCOP, the cell counts for a valley of the first state may be obtained by applying the different read voltages RV3, RV2 and RV1 to a wordline WL (step S310). For example, as illustrated in FIGS. 3 and 9, third on-cells having threshold voltages lower than or equal to a third count voltage level CVL3 may be counted by applying a third read voltage RV3 having the third count voltage level CVL3 to the wordline WL, second on-cells having threshold voltages lower than or equal to a second count voltage level CLV2 may be counted by applying a second read voltage RV2 having the second count voltage level CVL2 to the wordline WL, and first on-cells having threshold voltages lower than or equal to a first count voltage level CLV1 may be counted by applying a first read voltage RV1 having the first count voltage level CLV1 to the wordline WL. However, since three precharge operations and three sensing operations may be performed to count the first, second and third on-cells, the method illustrated in FIGS. 8 and 9 may require more time than a method illustrated in FIGS. 5 and 7. A first cell count CC1 of memory cells having threshold voltages between the first count voltage level CVL1 and the second count voltage level CVL2 may be calculated by subtracting the number of the first on-cells from the number of the second on-cells, and a second cell count CC2 of memory cells having threshold voltages between the second count voltage level CVL2 and the third count voltage level CVL3 may be calculated by subtracting the number of the second on-cells from the number of the third on-cells.

In a read voltage level determination time TRVLD, a first read voltage level RVL1 for the first state may be determined based on the first and second cell counts CC1 and CC2 for the first state and at least one first reference parameter RP7A, RP7B and RP7C for the first state (step S320), and a second read voltage level RVL2 for the second state may be determined based on the first and second cell counts CC1 and CC2 for the first state and at least one second reference parameter RP3A and RP3B for the second state (step S370).

In a first sensing time TSOP1, a first sensing operation for the first state may be performed by applying a read voltage RV4 having the first read voltage level RVL1 to the wordline WL (step S330). For example, to perform the first sensing operation, a plurality of bitlines and sensing nodes may be precharged, the read voltage RV4 having the first read voltage level RVL1 may be applied to the wordline WL, and a sensing node latch operation may be performed at a reference time point for the first state.

In a second sensing time TSOP2, a second sensing operation for the second state may be performed by applying a read voltage RV5 having the second read voltage level RVL2 to the wordline WL (step S380). For example, to perform the second sensing operation, the plurality of bitlines and the sensing nodes may be precharged, the read voltage RV5 having the second read voltage level RVL2 may be applied to the wordline WL, and a sensing node latch operation may be performed at a reference time point for the second state.

Figure 10:
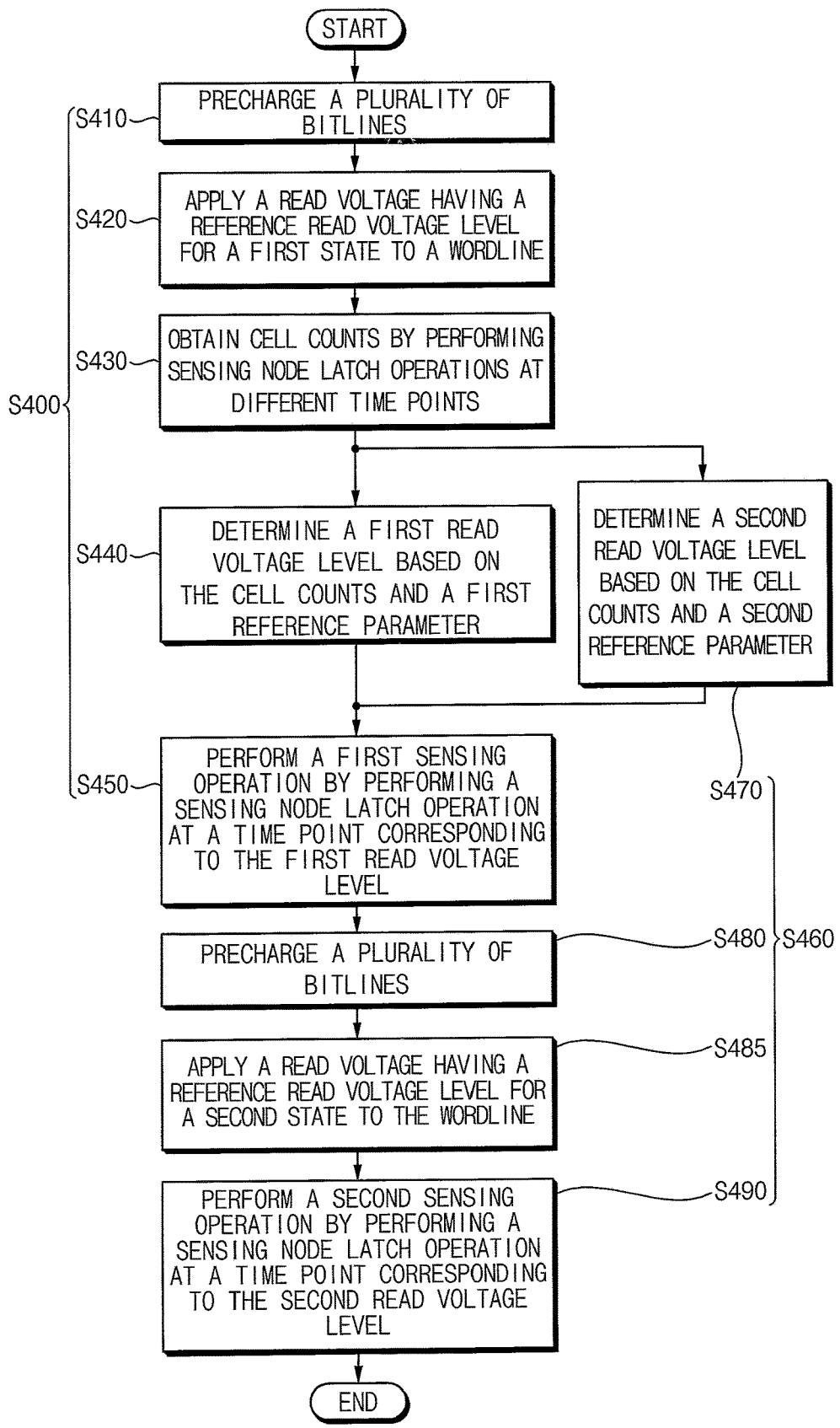
FIG. 10 is a flowchart illustrating a method of reading data in a nonvolatile memory device according to exemplary embodiments.
Figure 11:
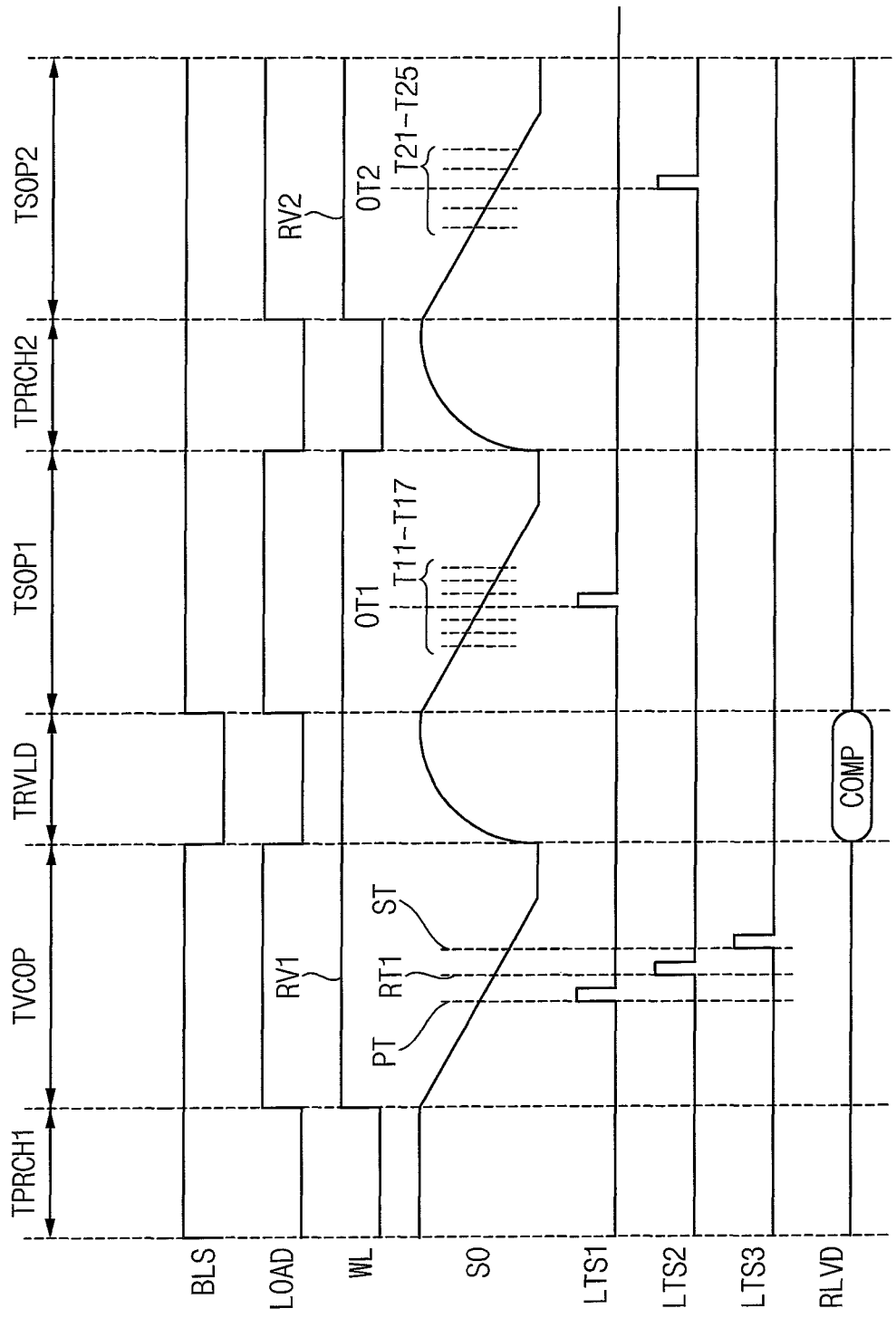
FIG. 11 is a timing diagram for describing an example of a method of reading data in a nonvolatile memory device according to exemplary embodiments.

FIG. 10 is a flowchart illustrating a method of reading data in a nonvolatile memory device according to exemplary embodiments, and FIG. 11 is a timing diagram for describing an example of a method of reading data in a nonvolatile memory device according to exemplary embodiments.

Referring to FIGS. 10 and 11, in a method of reading data in a nonvolatile memory device, a first read operation for a first state may be performed (step S400), and a second read operation for a second state may be performed (step S460). Unlike a method of FIG. 5 which performs a second sensing operation by using a read voltage having a second read voltage level, the method of FIG. 10 may perform the second sensing operation by performing a sensing node latch operation at a time point corresponding to the second read voltage level.

In a first precharge time TPRCH1, a plurality of bitlines and sensing nodes may be precharged (step S410). While the first read operation is performed, a read voltage RV1 having a reference read voltage level for the first state may be applied to a wordline WL (step S420). In a valley cell count time TVCOP, cell counts for a valley of the first state may be obtained by performing sensing node latch operations at different time points PT, RT1 and ST (step S430). In a read voltage level determination time TRVLD, a first read voltage level for the first state may be determined based on the cell counts for the first state and at least one first reference parameter for the first state (step S440), and a second read voltage level for the second state may be determined based on the cell counts for the first state and at least one second reference parameter for the second state (step S470).

In a first sensing time TSOP1, an optimal time point OT1 corresponding to the first read voltage level may be selected from a plurality of time points T11-T17, and a first sensing operation for the first state may be performed by performing a sensing node latch operation at the optimal time point OT1 corresponding to the first read voltage level (step S450).

In a second precharge time TPRCH2, the plurality of bitlines and the sensing nodes may be precharged (step S480). In a second sensing time TSOP2, a read voltage RV2 having a read voltage having a reference read voltage level for the second state to the wordline WL (step S485). Further, in the second sensing time TSOP2, an optimal time point OT2 corresponding to the second read voltage level may be selected from a plurality of time points T21-T25, and the second sensing operation for the second state may be performed by performing the sensing node latch operation at the optimal time point OT2 corresponding to the second read voltage level (step S490).

Figure 12:
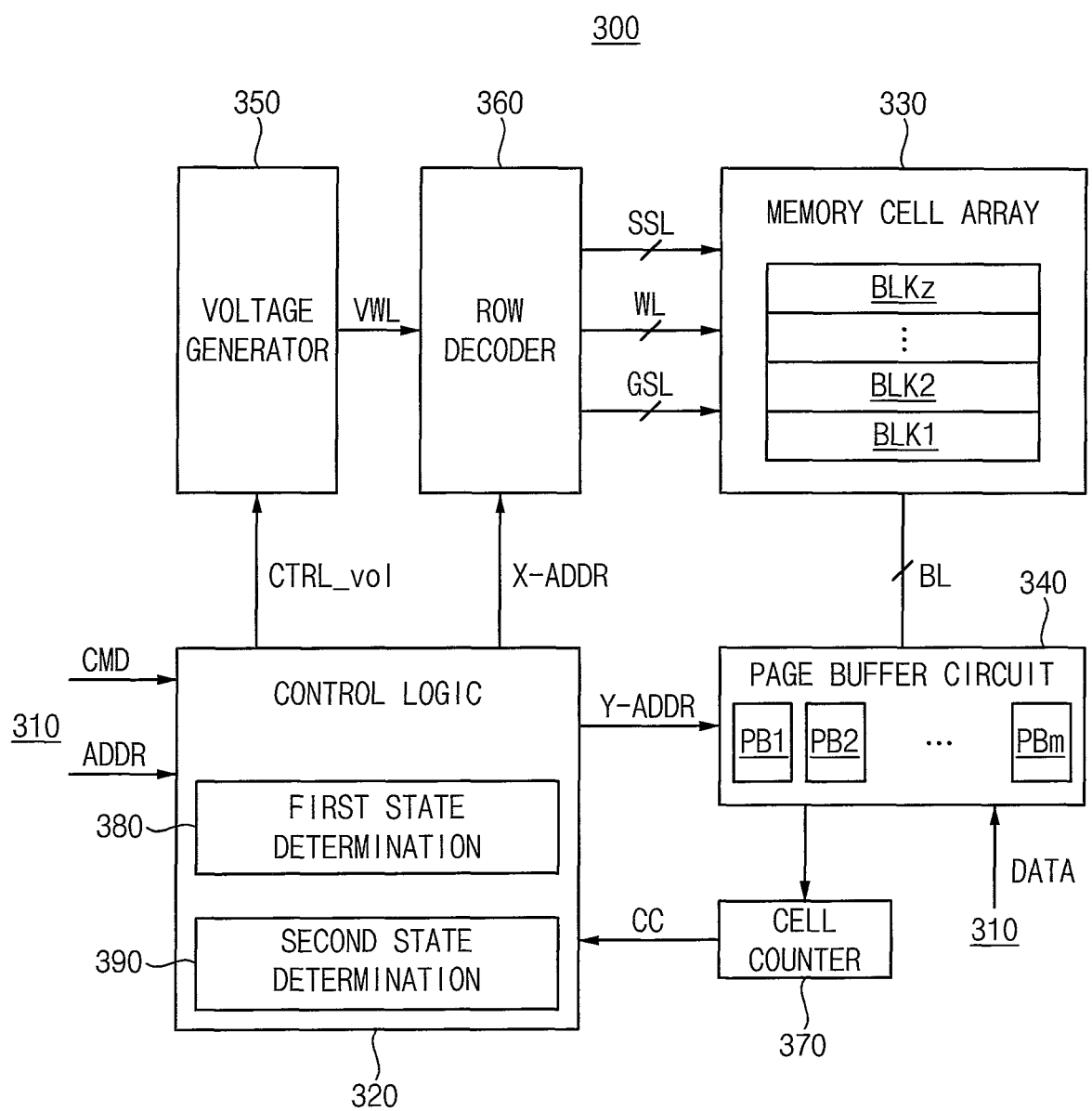
FIG. 12 is a block diagram illustrating a nonvolatile memory device according to exemplary embodiments.

FIG. 12 is a block diagram illustrating a nonvolatile memory device according to exemplary embodiments.

Referring to FIG. 12, a nonvolatile memory device 300 may include a memory cell array 330, and a control circuit that performs an operation for the memory cell array 330. The control circuit may include a control logic circuitry 320, a page buffer circuit 340, a voltage generator 350, a row decoder 360 and a cell counter 370. Although not shown in FIG. 12, the nonvolatile memory device 300 may further include memory interface circuitry 310. In addition, the nonvolatile memory device 300 may further include column logic, a pre-decoder, a temperature sensor, a command decoder, and/or an address decoder.

The control logic circuitry 320 may control all various operations of the nonvolatile memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer circuit 340 through bitlines BL and be connected to the row decoder 360 through wordlines WL, string selection lines SSL, and ground selection lines GSL.

In an exemplary embodiment, the memory cell array 330 may include a 3D memory cell array, which includes a plurality of NAND strings. Each of the NAND strings may include memory cells respectively connected to wordlines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an exemplary embodiment, the memory cell array 330 may include a 2D memory cell array, which includes a plurality of NAND strings arranged in a row direction and a column direction.

The page buffer circuit 340 may include a plurality of page buffers PB1 to PBm (here, m is an integer greater than or equal to 3), which may be respectively connected to the memory cells through a plurality of bitlines BL. The page buffer circuit 340 may select at least one of the bitlines BL in response to the column address Y-ADDR. The page buffer circuit 340 may operate as a write driver or a sense amplifier according to an operation mode. For example, during a program operation, the page buffer circuit 340 may apply a bitline voltage corresponding to data to be programmed, to the selected bitline. During a read operation, the page buffer circuit 340 may sense current or a voltage of the selected bitline BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a wordline voltage VWL.

The row decoder 360 may select one of a plurality of wordlines WL and select one of a plurality of string selection lines SSL in response to the row address X-ADDR. For example, the row decoder 360 may apply the program voltage and the program verification voltage to the selected wordline WL during a program operation and apply the read voltage to the selected word line WL during a read operation.

In the nonvolatile memory device 300 according to exemplary embodiments, the memory cells of the memory cell array 330 may have a plurality of states including a first state and a second state, and the control circuit may perform a first read operation for the first state and a second read operation for the second state. For example, the control circuit may perform a valley cell count operation for the first state, and the cell counter 370 may generate cell counts CC for a valley of the first state. A first state determination block 380 of the control logic circuitry 320 may determine a first read voltage level for the first state based on the cell counts CC for the first state and at least one first reference parameter for the first state, and a second state determination block 390 of the control logic circuitry 320 may determine a second read voltage level for the second state based on the cell counts CC for the first state and at least one second reference parameter for the second state. Thus, different state determination blocks 380 and 390 may substantially simultaneously determine the first and second read voltage levels for the first and second states by using different logics, respectively. Further, the control circuit may perform a first sensing operation for the first state by using the first read voltage level, and may perform a second sensing operation for the second state by using the second read voltage level. Accordingly, an optimal read voltage level for each state may be rapidly and accurately determined, and accurate data may be read.

Figure 13:
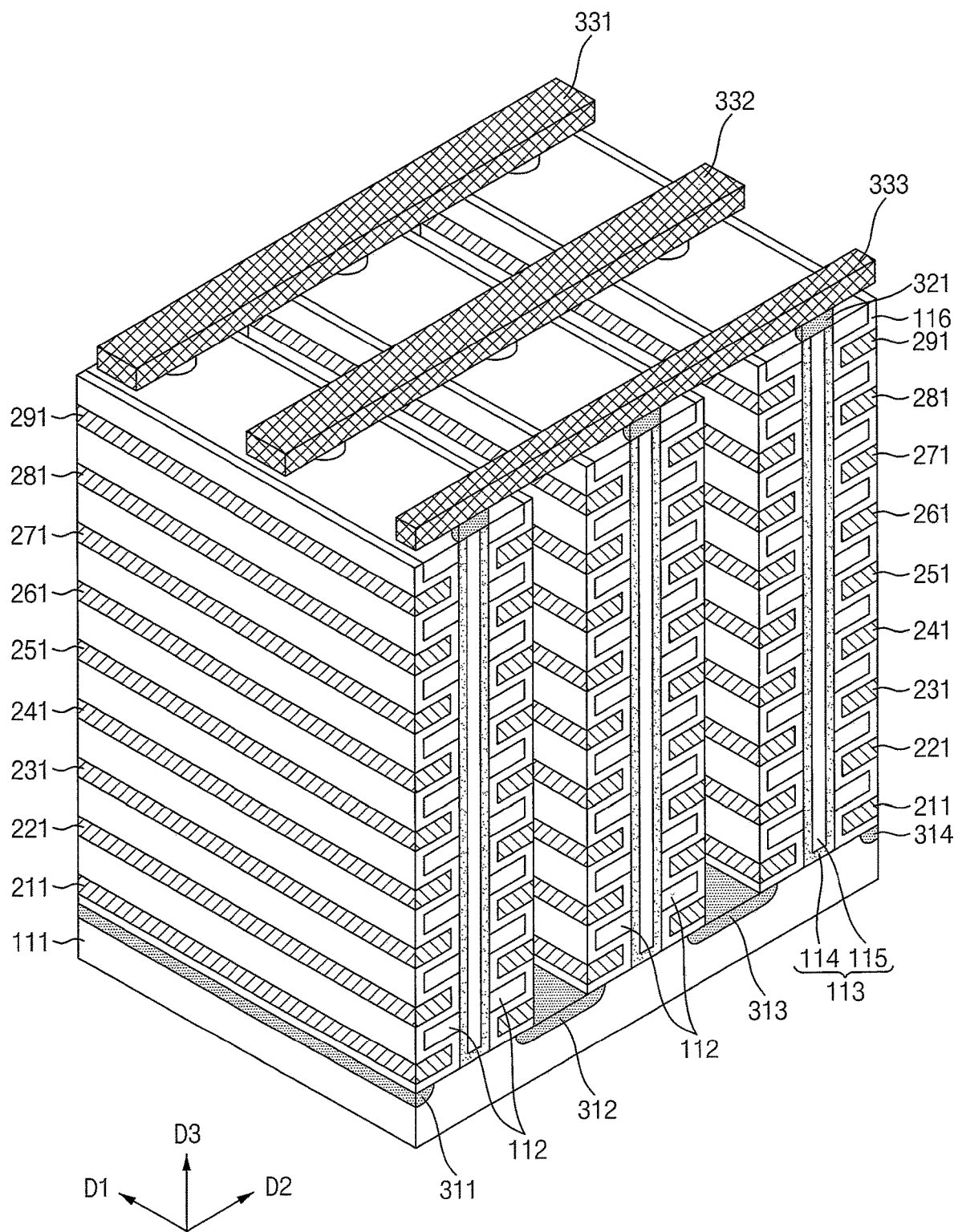
FIG. 13 is a perspective view illustrating an example of a memory block included in a memory cell array of the nonvolatile memory device of FIG. 12.

FIG. 13 is a perspective view illustrating an example of a memory block included in a memory cell array of the nonvolatile memory device of FIG. 12.

Referring to FIG. 13, a memory block BLKi includes a plurality of cell strings (e.g., a plurality of vertical NAND strings) which are formed on a substrate in a three-dimensional structure (or a vertical structure). The memory block BLKi includes structures extending along first, second and third directions D1, D2 and D3.

A substrate 111 is provided. For example, the substrate 111 may have a well of a first type of charge carrier impurity (e.g., a first conductivity type) therein. For example, the substrate 111 may have a p-well formed by implanting a group 3 element such as boron (B). In particular, the substrate 111 may have a pocket p-well provided within an n-well. In an exemplary embodiment, the substrate 111 has a p-type well (or a p-type pocket well). However, the conductivity type of the substrate 111 is not limited to p-type.

A plurality of doping regions 311, 312, 313 and 314 arranged along the second direction D2 are provided in/on the substrate 111. This plurality of doping regions 311 to 314 may have a second type of charge carrier impurity (e.g., a second conductivity type) different from the first type of the substrate 111. In one exemplary embodiment of the invention, the first to fourth doping regions 311 to 314 may have n-type. However, the conductivity type of the first to fourth doping regions 311 to 314 is not limited to n-type.

A plurality of insulation materials 112 extending along the first direction D1 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include or may be formed of an insulation material such as an oxide layer.

A plurality of pillars 113 penetrating the insulation materials along the third direction D3 are sequentially disposed along the first direction D1 on a region of the substrate 111 between the first and second doping regions 311 and 312. For example, the plurality of pillars 113 penetrates the insulation materials 112 to contact the substrate 111.

In some exemplary embodiments, each pillar 113 may include a plurality of materials. For example, a channel layer 114 of each pillar 113 may include or may be formed of a silicon material having a first conductivity type. For example, the channel layer 114 of each pillar 113 may include or may be formed of a silicon material having the same conductivity type as the substrate 111. In one exemplary embodiment of the invention, the channel layer 114 of each pillar 113 includes or is formed of p-type silicon. However, the channel layer 114 of each pillar 113 is not limited to the p-type silicon.

An internal material 115 of each pillar 113 includes an insulation material. For example, the internal material 115 of each pillar 113 may include or may be formed of an insulation material such as a silicon oxide. In some examples, the internal material 115 of each pillar 113 may include an air gap. The term "air" as discussed herein, may refer to atmospheric air, or other gases that may be present during the manufacturing process.

An insulation layer 116 is provided along the exposed surfaces of the insulation materials 112, the pillars 113, and the substrate 111, on a region between the first and second doping regions 311 and 312. For example, the insulation layer 116 provided on surfaces of the insulation material 112 may be interposed between pillars 113 and a plurality of stacked first conductive materials 211, 221, 231, 241, 251, 261, 271, 281 and 291, as illustrated. In some examples, the insulation layer 116 need not be provided between the first conductive materials 211 to 291 corresponding to ground selection lines GSL (e.g., 211) and string selection lines SSL (e.g., 291). For example, the ground selection lines GSL are the lowermost ones of the stack of first conductive materials 211 to 291 and the string selection lines SSL are the uppermost ones of the stack of first conductive materials 211 to 291.

The plurality of first conductive materials 211 to 291 are provided on surfaces of the insulation layer 116, in a region between the first and second doping regions 311 and 312. For example, the first conductive material 211 extending along the first direction D1 is provided between the insulation material 112 adjacent to the substrate 111 and the substrate 111. In more detail, the first conductive material 211 extending along the first direction D1 is provided between the insulation layer 116 at the bottom of the insulation material 112 adjacent to the substrate 111 and the substrate 111.

A first conductive material extending along the first direction D1 is provided between the insulation layer 116 at the top of the specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may be formed of a conductive metal, but in other exemplary embodiments of the invention the first conductive materials 211 to 291 may include or may be formed of a conductive material such as a polysilicon.

The same structures as those on the first and second doping regions 311 and 312 may be provided in a region between the second and third doping regions 312 and 313. In the region between the second and third doping regions 312 and 313, a plurality of insulation materials 112 are provided, which extend along the first direction D1. A plurality of pillars 113 is provided that are disposed sequentially along the first direction D1 and penetrate the plurality of insulation materials 112 along the third direction D3. An insulation layer 116 is provided on the exposed surfaces of the plurality of insulation materials 112 and the plurality of pillars 113, and a plurality of first conductive materials 211 to 291 extend along the first direction D1. Similarly, the same structures as those on the first and second doping regions 311 and 312 may be provided in a region between the third and fourth doping regions 313 and 314.

A plurality of drain regions 321 are provided on the plurality of pillars 113, respectively. The drain regions 321 may include or may be formed of silicon materials doped with a second type of charge carrier impurity. For example, the drain regions 321 may include or may be formed of silicon materials doped with an n-type dopant. In one exemplary embodiment of the invention, the drain regions 321 include or are formed of n-type silicon materials. However, the drain regions 321 are not limited to n-type silicon materials.

On the drain regions, a plurality of second conductive materials 331, 332 and 333 are provided, which extend along the second direction D2. The second conductive materials 331 to 333 are disposed along the first direction D1, being spaced apart from each other by a specific distance. The second conductive materials 331 to 333 are respectively connected to the drain regions 321 in a corresponding region. The drain regions 321 and the second conductive material 333 extending along the second direction D2 may be connected through each contact plug. Each contact plug may be, for example, a conductive plug formed of a conductive material such as a metal. The second conductive materials 331 to 333 may include or may be formed of metal materials. The second conductive materials 331 to 333 may include or may be formed of conductive materials such as a polysilicon.

In the example of FIG. 13, the first conductive materials 211 to 291 may be used to form the wordlines WL, the string selection lines SSL and the ground selection lines GSL. For example, the first conductive materials 221 to 281 may be used to form the wordlines WL, where conductive materials that belong to the same layer may be interconnected. The second conductive materials 331 to 333 may be used to form the bitlines BL. The number of layers of the first conductive materials 211 to 291 may be changed variously according to process and control techniques.

Figure 14:
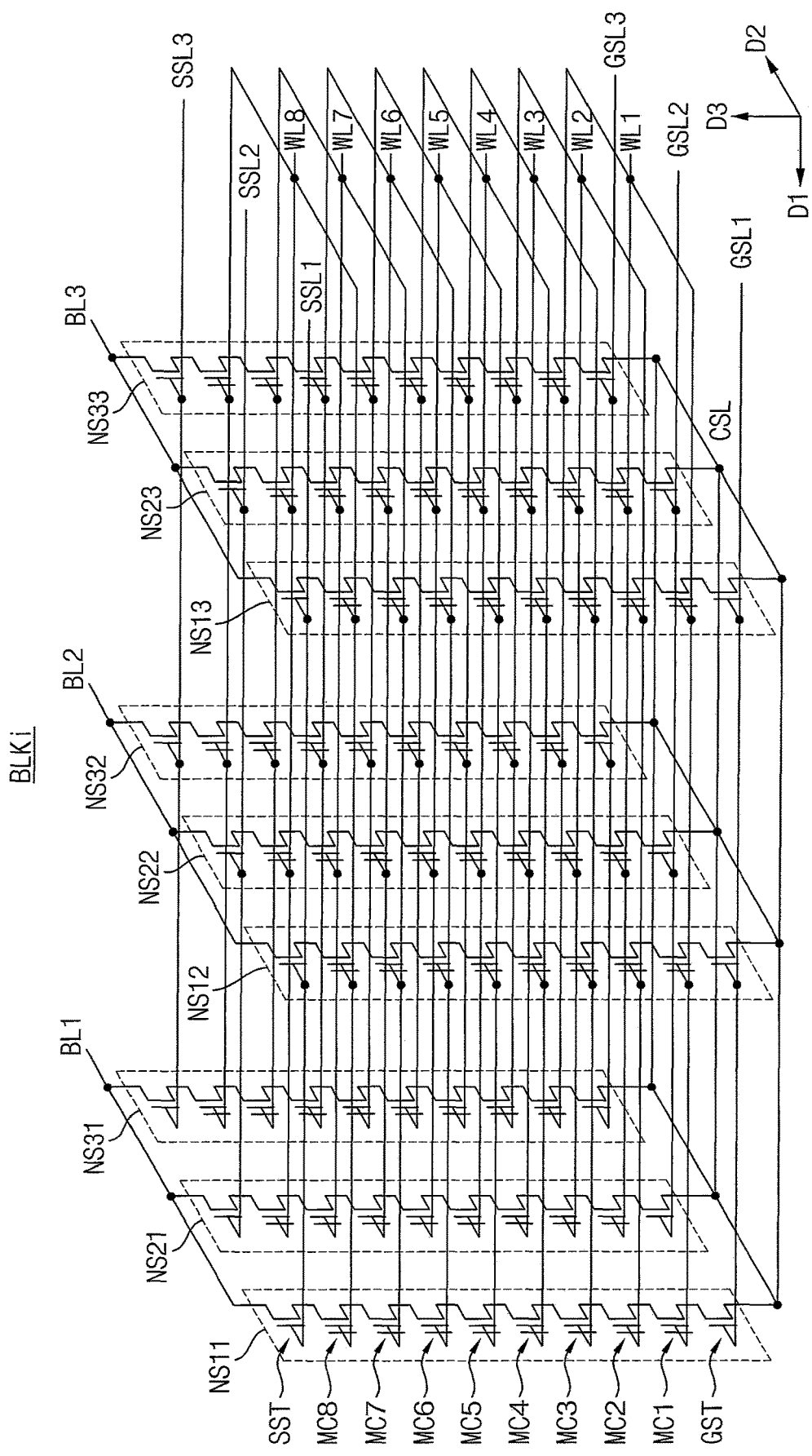
FIG. 14 is a circuit diagram illustrating an equivalent circuit of the memory block described with reference to FIG. 13.

FIG. 14 is a circuit diagram illustrating an equivalent circuit of the memory block described with reference to FIG. 13.

FIG. 14 is a diagram of a 3D V-NAND structure applicable to a universal flash storage (UFS) device according to an exemplary embodiment. When a storage module of the UFS device is implemented as a 3D V-NAND flash memory, each of a plurality of memory blocks included in the storage module may be represented by an equivalent circuit shown in FIG. 14.

A memory block BLKi shown in FIG. 14 may refer to a 3D memory block having a 3D structure formed on a substrate. For example, a plurality of memory NAND strings included in the memory block BLKi may be formed in a vertical direction to the substrate.

Referring to FIG. 14, the memory block BLKi may include a plurality of memory NAND strings (e.g., NS11 to NS33), which are connected between bitlines BL1, BL2, and BL3 and a common source line CSL. Each of the memory NAND strings NS11 to NS33 may include a string selection transistor SST, a plurality of memory cells (e.g., MC1, MC2, . . . , and MC8), and a ground selection transistor GST. Each of the memory NAND strings NS11 to NS33 is illustrated as including eight memory cells MC1, MC2, . . . , and MC8 in FIG. 14, without being limited thereto.

The string selection transistor SST may be connected to string selection lines SSL1, SSL2, and SSL3 corresponding thereto. Each of the memory cells MC1, MC2, . . . , and MC8 may be connected to a corresponding one of gate lines GTL1, GTL2, . . . , and GTL8. The gate lines GTL1, GTL2, . . . , and GTL8 may respectively correspond to wordlines, and some of the gate lines GTL1, GTL2, . . . , and GTL8 may correspond to dummy wordlines. The ground selection transistor GST may be connected to ground selection lines GSL1, GSL2, and GSL3 corresponding thereto. The string selection transistor SST may be connected to the bitlines BL1, BL2, and BL3 corresponding thereto, and the ground selection transistor GST may be connected to the common source line CSL.

Wordlines (e.g., WL1) at the same level may be connected in common, and the ground selection lines GSL1, GSL2, and GSL3 and the string selection lines SSL1, SSL2, and SSL3 may be separated from each other. FIG. 14 illustrates a case in which a memory block BLKi is connected to eight gate lines GTL1, GTL2, . . . , and GTL8 and three bitlines BL1, BL2, and BL3, without being limited thereto.

Although the memory cell array included in the nonvolatile memory device according to exemplary embodiments is described based on a NAND flash memory device, the nonvolatile memory device according to exemplary embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc.

Figure 15:
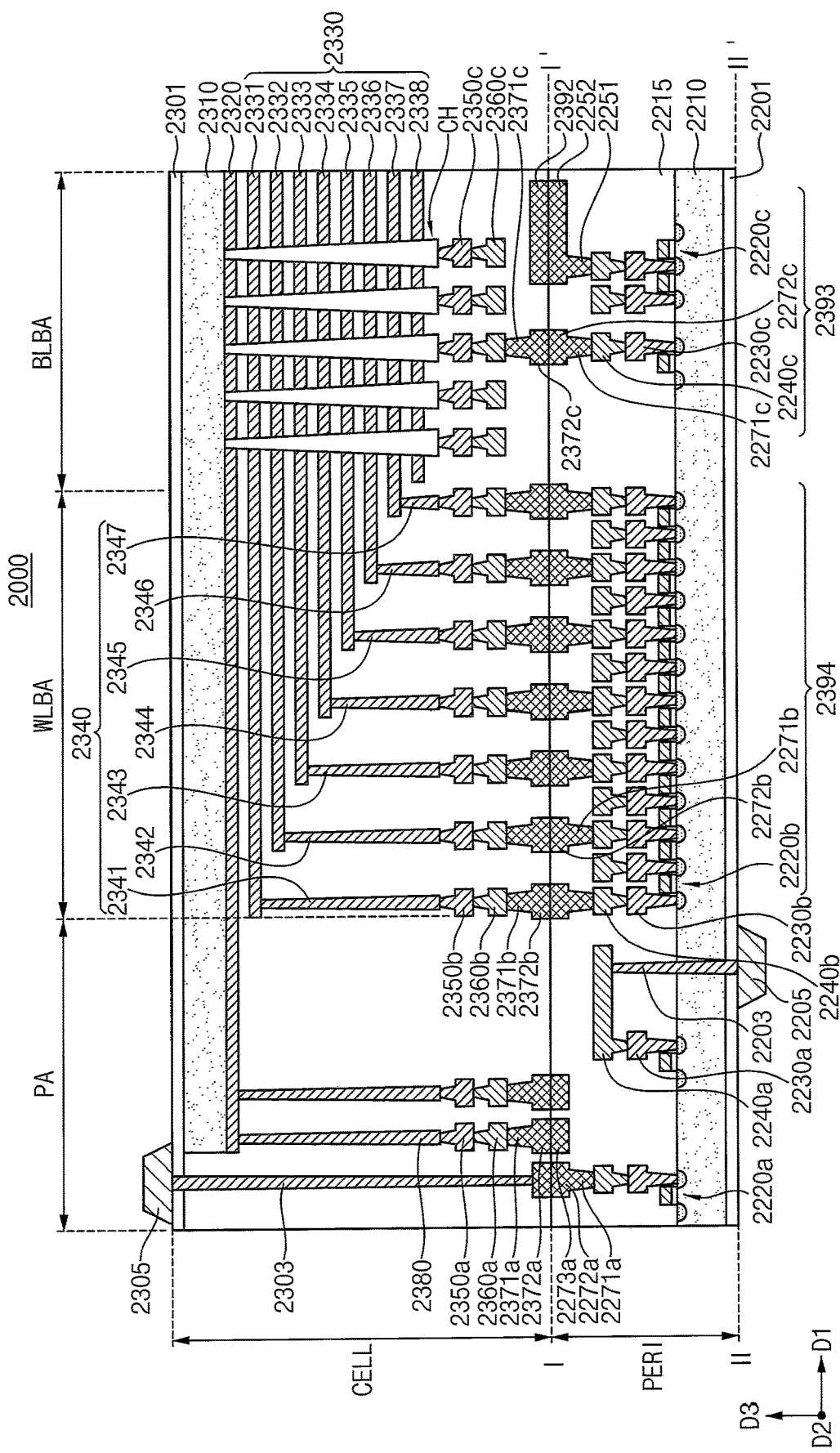
FIG. 15 is a cross-sectional view of a nonvolatile memory device according to exemplary embodiments.

FIG. 15 is a cross-sectional view of a nonvolatile memory device according to exemplary embodiments.

Referring to FIG. 15, a nonvolatile memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The exemplary embodiment, however, may not be limited thereto. For example, the bonding metals may also be formed of aluminum (Al) or tungsten (W).

Each of the peripheral circuit region PERI and the cell region CELL of the nonvolatile memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an exemplary embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an exemplary embodiment illustrated in FIG. 15, although only the first metal layers 2230a, 2230b, and 2230c and the second metal layers 2240a, 2240b, and 2240c are shown and described, the exemplary embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331 to 2338 (i.e., 2330) may be stacked in a third direction D3 (e.g., a Z-axis direction), perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH may extend in the third direction D3 (e.g., the Z-axis direction), perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an exemplary embodiment, the bitline 2360c may extend in a second direction D2 (e.g., a Y-axis direction), parallel to the upper surface of the second substrate 2310.

In an exemplary embodiment illustrated in FIG. 15, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. The bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the wordline bonding area WLBA, the plurality of wordlines 2330 may extend in a first direction D1 (e.g., an X-axis direction), parallel to the upper surface of the second substrate 2310 and perpendicular to the second direction D2, and may be connected to a plurality of cell contact plugs 2341 to 2347 (i.e., 2340). The plurality of wordlines 2330 and the plurality of cell contact plugs 2340 may be connected to each other in pads provided by at least a portion of the plurality of wordlines 2330 extending in different lengths in the first direction D1. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b forming a row decoder 2394 in the peripheral circuit region PERI. In an exemplary embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal alloy or compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the exemplary embodiment, the second input/output pad 2305 is electrically connected to a circuit element 2220a.

According to exemplary embodiments, the second substrate 2310 and the common source line 2320 may not be disposed in an area in which the second input/output contact plug 2303 is disposed. Also, the second input/output pad 2305 may not overlap the wordlines 2330 in the third direction D3 (e.g., the Z-axis direction). The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to exemplary embodiments, the first input/output pad 2205 and the second input/output pad 2305 may be selectively formed. For example, the nonvolatile memory device 2000 may include only the first input/output pad 2205 disposed on the first substrate 2210 or the second input/output pad 2305 disposed on the second substrate 2310. Alternatively, the nonvolatile memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371*b* and 2372*b* of the cell region CELL by a Cu-to-Cu bonding.

Further, in the bitline bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an exemplary embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Figure 16:
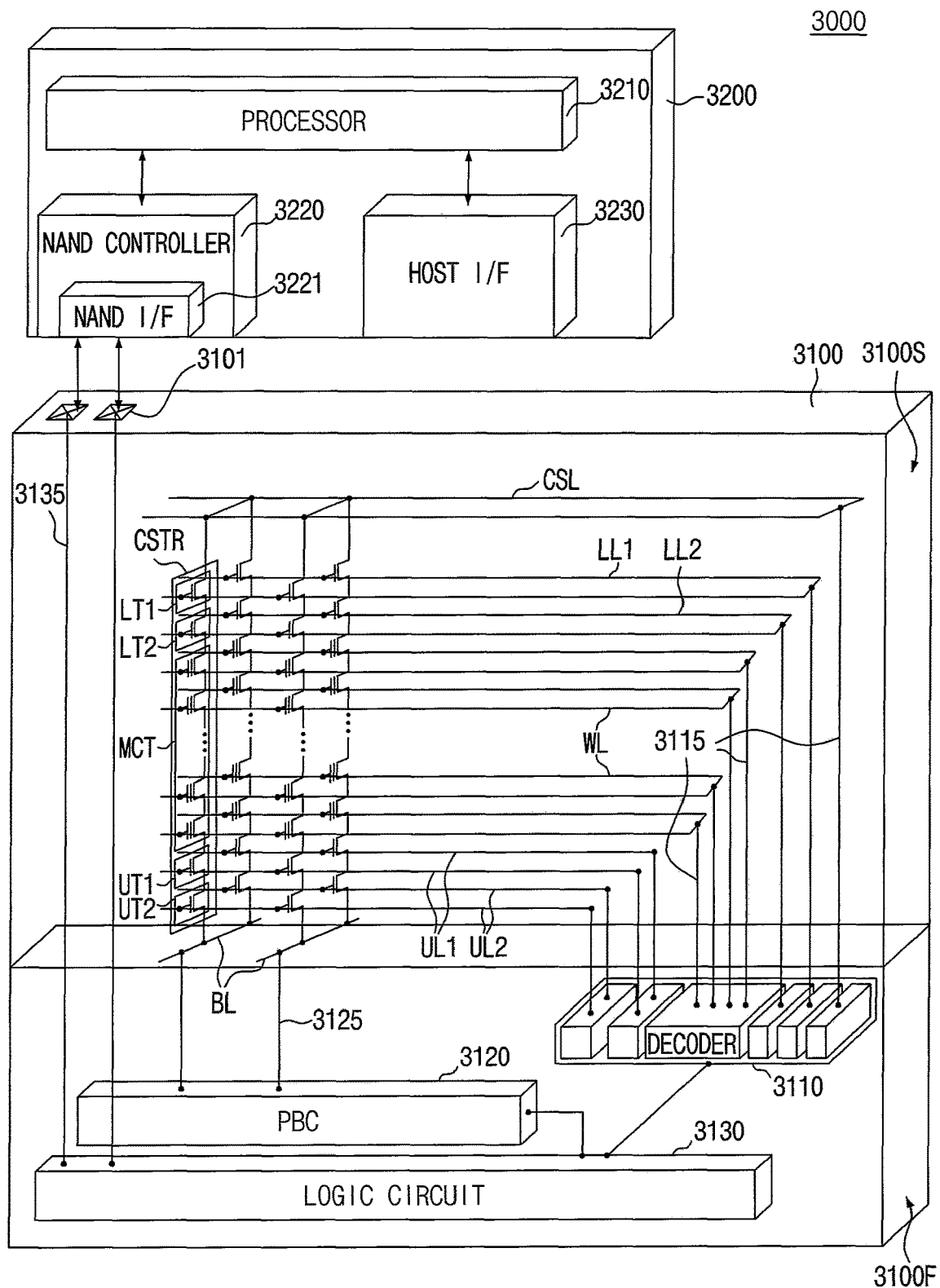
FIG. 16 is a block diagram illustrating an electronic system including a nonvolatile memory device according to exemplary embodiments.

FIG. 16 is a block diagram illustrating an electronic system including a nonvolatile memory device according to exemplary embodiments.

Referring to FIG. 16, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a memory device, for example, a non-volatile memory device that is described above with reference to FIGS. 12 through 15. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with exemplary embodiments.

In exemplary embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In exemplary embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

The inventive concept may be applied to various devices and systems that include the nonvolatile memory devices. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of exemplary embodiments and is not to be construed as limiting thereof. Although some exemplary embodiments have been described, those skilled in the art will readily appreciate that many modifications are possible in the exemplary embodiments without materially departing from the novel teachings and advantages of the exemplary embodiments. Accordingly, all such modifications are intended to be included within the scope of the exemplary embodiments as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of reading data in a nonvolatile memory device including a plurality of memory cells having a plurality of states including a first state and a second state, the method comprising:
performing a first read operation for the first state; and
performing a second read operation for the second state,
wherein performing the first read operation includes:
obtaining cell counts for the first state by performing a valley cell count operation for the first state, the cell counts comprising a first cell count of a first region where the first state overlaps the second state in a plot characterizing a number of on-cells of the first state and a number of on-cells of the second state against threshold voltage;
determining a first read voltage level for the first state based on the first cell count and at least one first reference parameter for the first state; and
performing a first sensing operation for the first state by using the first read voltage level, and
wherein performing the second read operation includes:
determining a second read voltage level for the second state and at least one second reference parameter for the second state; and
performing a second sensing operation for the second state by using the second read voltage level.

2. The method of claim 1, wherein the first state is a high state higher than the second state, and
wherein the second state is a low state lower than the first state.

3. The method of claim 1, wherein the first reference parameter and the second reference parameter have different values.

4. The method of claim 1, wherein a number of the second reference parameter is different from a number of the first reference parameter.

5. The method of claim 1, wherein, while the first read operation is performed, a plurality of bitlines connected to the plurality of memory cells is precharged only once.

6. The method of claim 1, wherein, while the first read operation is performed, a read voltage having a reference read voltage level for the first state is applied to a wordline connected to the plurality of memory cells.

7. The method of claim 1, wherein the first region extends between a first count voltage level that is lower than a reference read voltage level for the first state and a second count voltage level that is the reference read voltage level among the plurality of memory cells; and
wherein determining the second read voltage level for the second state is based on a second cell count of the cell counts, the second cell count being of a second region of on-cells of the first and second states having threshold voltages between the second count voltage level and a third count voltage level that is higher than the reference read voltage level among the plurality of memory cells and lower than a maximum threshold voltage of the first state.

8. The method of claim 7, wherein obtaining the cell counts includes:
applying a read voltage having the reference read voltage level for the first state to a wordline connected to the plurality of memory cells;
counting first on-cells having threshold voltages lower than or equal to the first count voltage level by performing a sensing node latch operation at a previous time point before a reference time point;
counting second on-cells having threshold voltages lower than or equal to the second count voltage level by performing the sensing node latch operation at the reference time point;
counting third on-cells having threshold voltages lower than or equal to the third count voltage level by performing the sensing node latch operation at a subsequent time point after the reference time point;
calculating the first cell count by subtracting a number of the first on-cells from a number of the second on-cells; and
calculating the second cell count by subtracting the number of the second on-cells from a number of the third on-cells.

9. The method of claim 7, wherein obtaining the cell counts includes:
counting first on-cells having threshold voltages lower than or equal to the first count voltage level by applying a first read voltage having the first count voltage level to a wordline connected to the plurality of memory cells;
counting second on-cells having threshold voltages lower than or equal to the second count voltage level by applying a second read voltage having the second count voltage level to the wordline;
counting third on-cells having threshold voltages lower than or equal to the third count voltage level by applying a third read voltage having the third count voltage level to the wordline;
calculating the first cell count by subtracting a number of the first on-cells from a number of the second on-cells; and
calculating the second cell count by subtracting the number of the second on-cells from a number of the third on-cells.

10. The method of claim 7, wherein determining the first read voltage level includes:
comparing the first cell count or the second cell count with the first reference parameter.

11. The method of claim 7, wherein determining the second read voltage level includes:
comparing the first cell count or the second cell count with the second reference parameter.

12. The method of claim 1, wherein performing the first sensing operation includes:
performing a sensing node latch operation at a time point corresponding to the first read voltage level.

13. The method of claim 1, wherein performing the first sensing operation includes:
applying a read voltage having the first read voltage level to a wordline connected to the plurality of memory cells.

14. The method of claim 1, wherein performing the second sensing operation includes:
applying a read voltage having the second read voltage level to a wordline connected to the plurality of memory cells.

15. The method of claim 1, wherein performing the second sensing operation includes:
applying a read voltage having a reference read voltage level for the second state to a wordline connected to the plurality of memory cells; and
performing a sensing node latch operation at a time point corresponding to the second read voltage level.

16. The method of claim 1, further comprising:
performing a third read operation for a third state,
wherein a third read voltage level used in the third read operation is determined based on the cell counts and at least one third reference parameter for the third state.

17. The method of claim 16, wherein the first, second and third reference parameters have different values, or numbers of the first, second and third reference parameters are different from each other.

18. A nonvolatile memory device comprising:
a memory cell array including a plurality of memory cells having a plurality of states including a first state and a second state; and
a control circuit configured to perform a first read operation for the first state and a second read operation for the second state,
wherein, to perform the first read operation, the control circuit obtains cell counts for a valley of the first state by performing a valley cell count operation for the first state, determines a first read voltage level for the first state based on the cell counts and at least one first reference parameter for the first state, and performs a first sensing operation for the first state by using the first read voltage level,
wherein the cell counts comprise a first cell count of a first region where the first state overlaps the second state in a plot characterizing a number of on-cells of the first state and a number of on-cells of the second state against threshold voltage, and
wherein, to perform the second read operation, the control circuit determines a second read voltage level for the second state based on the cell counts and at least one second reference parameter for the second state, and performs a second sensing operation for the second state by using the second read voltage level.

19. The nonvolatile memory device of claim 18, wherein the control circuit includes:
a cell counter configured to generate the cell counts;
a first state determination block configured to determine the first read voltage level for the first state based on the cell counts and the first reference parameter; and
a second state determination block configured to determine the second read voltage level for the second state based on the cell counts and the second reference parameter.

\* \* \* \* \*